(12) United States Patent
Sawada et al.

(10) Patent No.: US 11,769,747 B2
(45) Date of Patent: Sep. 26, 2023

(54) SEMICONDUCTOR DEVICE AND METHOD OF MANUFACTURING THE SAME

(71) Applicant: Kioxia Corporation, Tokyo (JP)

(72) Inventors: Genki Sawada, Mie (JP); Masayoshi Tagami, Kuwana (JP); Jun Iijima, Yokkaichi (JP); Ippei Kume, Yokkaichi (JP); Kiyomitsu Yoshida, Kuwana (JP)

(73) Assignee: Kioxia Corporation, Tokyo (JP)

( * ) Notice: Subject to any disclaimer, the term of this patent is extended or adjusted under 35 U.S.C. 154(b) by 9 days.

(21) Appl. No.: 17/350,473

(22) Filed: Jun. 17, 2021

(65) Prior Publication Data

US 2022/0189905 A1 Jun. 16, 2022

(30) Foreign Application Priority Data

Dec. 16, 2020 (JP) .................................. 2020-208637

(51) Int. Cl.
*H01L 23/00* (2006.01)
*H01L 25/18* (2023.01)

(52) U.S. Cl.
CPC .............. *H01L 24/32* (2013.01); *H01L 24/05* (2013.01); *H01L 24/09* (2013.01); *H01L 24/83* (2013.01); *H01L 25/18* (2013.01); *H01L 24/29* (2013.01); *H01L 2224/05073* (2013.01); *H01L 2224/05124* (2013.01); *H01L 2224/05149* (2013.01); *H01L 2224/05166* (2013.01); *H01L 2224/05573* (2013.01); *H01L 2224/05647* (2013.01); *H01L 2224/09515* (2013.01); *H01L 2224/29186* (2013.01); *H01L 2224/32105* (2013.01); *H01L 2224/32145* (2013.01); *H01L 2224/32501* (2013.01); *H01L 2224/83201* (2013.01); *H01L 2224/83896* (2013.01); *H01L 2224/83948* (2013.01)

(58) Field of Classification Search
CPC ........... H01L 24/32; H01L 2224/32501; H01L 24/05
See application file for complete search history.

(56) References Cited

U.S. PATENT DOCUMENTS

2015/0108648 A1* 4/2015 Tsumura ................. H01L 24/80
438/107
2017/0358553 A1* 12/2017 Kim ........................ H01L 24/02

FOREIGN PATENT DOCUMENTS

JP 2015-79901 A 4/2015
JP 2020-43120 A 3/2020

* cited by examiner

*Primary Examiner* — Dale E Page
*Assistant Examiner* — Wilner Jean Baptiste
(74) *Attorney, Agent, or Firm* — Oblon, McClelland, Maier & Neustadt, L.L.P.

(57) ABSTRACT

In one embodiment, a semiconductor device includes a first insulator. The device further includes a first pad provided in the first insulator, and including first and second layers provided on lateral and lower faces of the first insulator in order. The device further includes a second insulator provided on the first insulator. The device further includes a second pad provided on the first pad in the second insulator, and including third and fourth layers provided on lateral and upper faces of the second insulator in order. The device further includes a first portion provided between an upper face of the first pad and a lower face of the second insulator or between a lower face of the second pad and an upper face of the first insulator, and including a metal element same as a metal element included in the first layer or the third layer.

14 Claims, 20 Drawing Sheets

SEMICONDUCTOR DEVICE AND METHOD OF MANUFACTURING THE SAME

CROSS REFERENCE TO RELATED APPLICATION

This application is based upon and claims the benefit of priority from the prior Japanese Patent Application No. 2020-208637, filed on Dec. 16, 2020, the entire contents of which are incorporated herein by reference.

FIELD

Embodiments described herein relate to a semiconductor device and a method of manufacturing the same.

BACKGROUND

When a semiconductor device is manufactured by bonding a metal pad and an insulator on a substrate onto a metal pad and an insulator on another substrate, there is a possibility that the surface of the metal pad on one substrate is exposed on the surface of the insulator on the other substrate. In this case, there is a possibility of causing a problem that metal atoms (for example, copper atoms) diffuse from the surface of the metal pad exposed on the surface of the insulator.

DETAILED DESCRIPTION

Embodiments will now be explained with reference to the accompanying drawings. In FIGS. 1 to 20, the same components are given the same signs and their duplicated description is omitted.

In one embodiment, a semiconductor device includes a first insulator. The device further includes a first pad provided in the first insulator, and including a first layer provided on a lateral face and a lower face of the first insulator, and a second layer provided on the lateral face and the lower face of the first insulator via the first layer. The device further includes a second insulator provided on the first insulator. The device further includes a second pad provided on the first pad in the second insulator, and including a third layer provided on a lateral face and an upper face of the second insulator, and a fourth layer provided on the lateral face and the upper face of the second insulator via the third layer. The device further includes a first portion provided between an upper face of the first pad and a lower face of the second insulator or between a lower face of the second pad and an upper face of the first insulator, and including a metal element same as a metal element included in the first layer or the third layer.

First Embodiment

Figure 1:
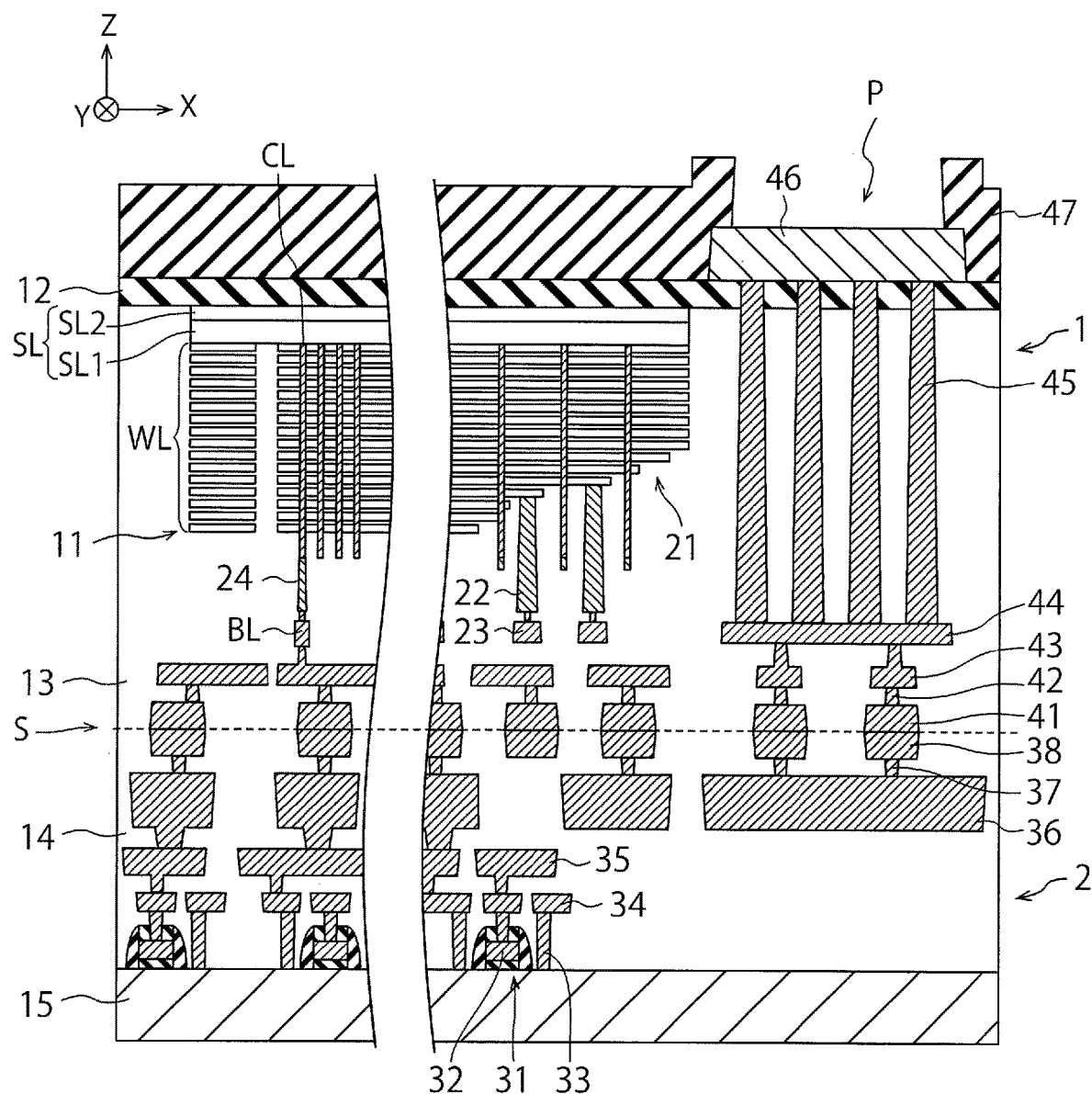
FIG. 1 is a sectional view showing a structure of a semiconductor device of a first embodiment.

FIG. 1 is a sectional view showing a structure of a semiconductor device of a first embodiment. The semiconductor device in FIG. 1 is a three-dimensional memory in which an array chip 1 and a circuit chip 2 are bonded together.

The array chip 1 includes a memory cell array 11 including a plurality of memory cells, an insulator 12 above the memory cell array 11, and an inter layer dielectric 13 below the memory cell array 11. An example of the insulator 12 is a silicon oxide film or a silicon nitride film. An example of the inter layer dielectric 13 is a silicon oxide film, or a stacked film including a silicon oxide film and another insulator. The inter layer dielectric 13 is an example of a second insulator.

The circuit chip 2 is provided below the array chip 1. Sign S denotes a bonding face between the array chip 1 and the circuit chip 2. The circuit chip 2 includes an inter layer dielectric 14, and a substrate 15 below the inter layer dielectric 14. An example of the inter layer dielectric 14 is a silicon oxide film or a stacked film including a silicon oxide film and another insulator. The inter layer dielectric 14 is an example of a first insulator. An example of the substrate 15 is a semiconductor substrate such as a silicon substrate.

FIG. 1 shows an X-direction and a Y-direction which are parallel to a surface of the substrate 15 and perpendicular to each other, and a Z-direction perpendicular to the surface of the substrate 15. In the present specification, the +Z-direction is handled as the upward direction, and the −Z-direction is handled as the downward direction. The −Z-direction may coincide with the direction of gravity or does not have to coincide with the same.

The array chip 1 includes, as a plurality of electrode layers in the memory cell array 11, a plurality of word lines WL and a source line SL. FIG. 1 shows a step structure portion 21 of the memory cell array 11. The word lines WL are electrically connected to a word interconnect layer 23 via contact plugs 22. Each columnar portion CL penetrating the plurality of word lines WL is electrically connected to a bit line BL via a via plug 24 and electrically connected to the source line SL. The source line SL includes a first layer SL1 which is a semiconductor layer, and a second layer SL2 which is a metal layer.

The circuit chip 2 includes a plurality of transistors 31. Each of the transistors 31 includes a gate electrode 32 provided on the substrate 15 via a gate insulator, and not-shown source diffusion layer and drain diffusion layer provided in the substrate 15. Moreover, the circuit chip 2 includes a plurality of contact plugs 33 which are provided on the gate electrodes 32, the source diffusion layers or the drain diffusion layers of these transistors 31, an interconnect layer 34 which is provided on these contact plugs 33 and includes a plurality of interconnects, and an interconnect layer 35 which is provided on the interconnect layer 34 and includes a plurality of interconnects.

The circuit chip 2 further includes an interconnect layer 36 which is provided on the interconnect layer 35 and includes a plurality of interconnects, a plurality of via plugs 37 provided on the interconnect layer 36, and a plurality of metal pads 38 provided on these via plugs 37. An example of each of the metal pads 38 is a metal layer including a Cu (copper) layer. Each of the metal pads 38 is an example of a first pad, and each of the via plugs 37 is an example of a first plug. The circuit chip 2 functions as a control circuit (logic circuit) which controls operation of the array chip 1. This control circuit is composed of the transistors 31 and the like and electrically connected to the metal pads 38.

The array chip 1 includes a plurality of metal pads 41 provided on the metal pads 38, and a plurality of via plugs 42 provided on the metal pads 41. Moreover, the array chip 1 includes an interconnect layer 43 which is provided on these via plugs 42 and includes a plurality of interconnects, and an interconnect layer 44 which is provided on the interconnect layer 43 and includes a plurality of interconnects. An example of each of the metal pads 41 is a metal layer including a Cu layer. Each of the metal pads 41 is an example of a second pad, and each of the via plugs 42 is an example of a second plug. The aforementioned bit line BL is included in the interconnect layer 44. The aforementioned control circuit is electrically connected to the memory cell array 11 via the metal pads 41 and 38 and the like and controls operation of the memory cell array 11 via the metal pads 41 and 38 and the like.

The array chip 1 further includes a plurality of via plugs 45 provided on the interconnect layer 44, a metal pad 46 provided on these via plugs 45 and on the insulator 12, and a passivation film 47 provided on the metal pad 46 and on the insulator 12. An example of the metal pad 46 is a metal layer including a Cu layer and functions as an external connection pad (bonding pad) of the semiconductor device in FIG. 1. An example of the passivation film 47 is an insulator such as a silicon oxide film and has an opening P which an upper face of the metal pad 46 is exposed from. The metal pad 46 can be connected, via this opening P, to an implementation circuit board or another device with bonding wires, solder balls, metal bumps and the like.

Figure 2:
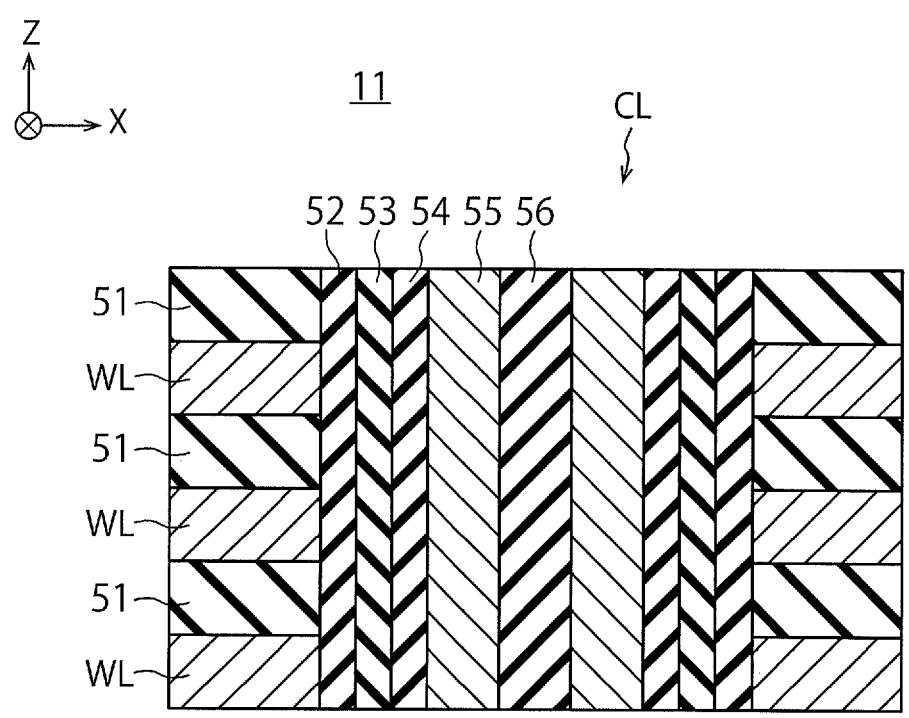
FIG. 2 is a sectional view showing a structure of a columnar portion CL of the first embodiment.

FIG. 2 is a sectional view showing a structure of the columnar portion CL of the first embodiment.

As shown in FIG. 2, the memory cell array 11 includes a plurality of word lines WL and a plurality of insulating layers 51 alternately stacked on the inter layer dielectric 13 (FIG. 1). An example of each of the word lines WL is a W (tungsten) layer. An example of each of the insulating layers 51 is a silicon oxide film.

The columnar portion CL sequentially includes a block insulator 52, a charge storage capacitor 53, a tunnel insulator 54, a channel semiconductor layer 55 and a core insulator 56. An example of the charge storage capacitor 53 is a silicon nitride film and is formed on lateral faces of the word lines WL and the insulating layers 51 via the block insulator 52. The charge storage capacitor 53 may be a semiconductor layer such as a polysilicon layer. An example of the channel semiconductor layer 55 is a polysilicon layer and is formed on a lateral face of the charge storage capacitor 53 via the tunnel insulator 54. Examples of the block insulator 52, the tunnel insulator 54 and the core insulator 56 are silicon oxide films or metal insulators.

Figure 3:
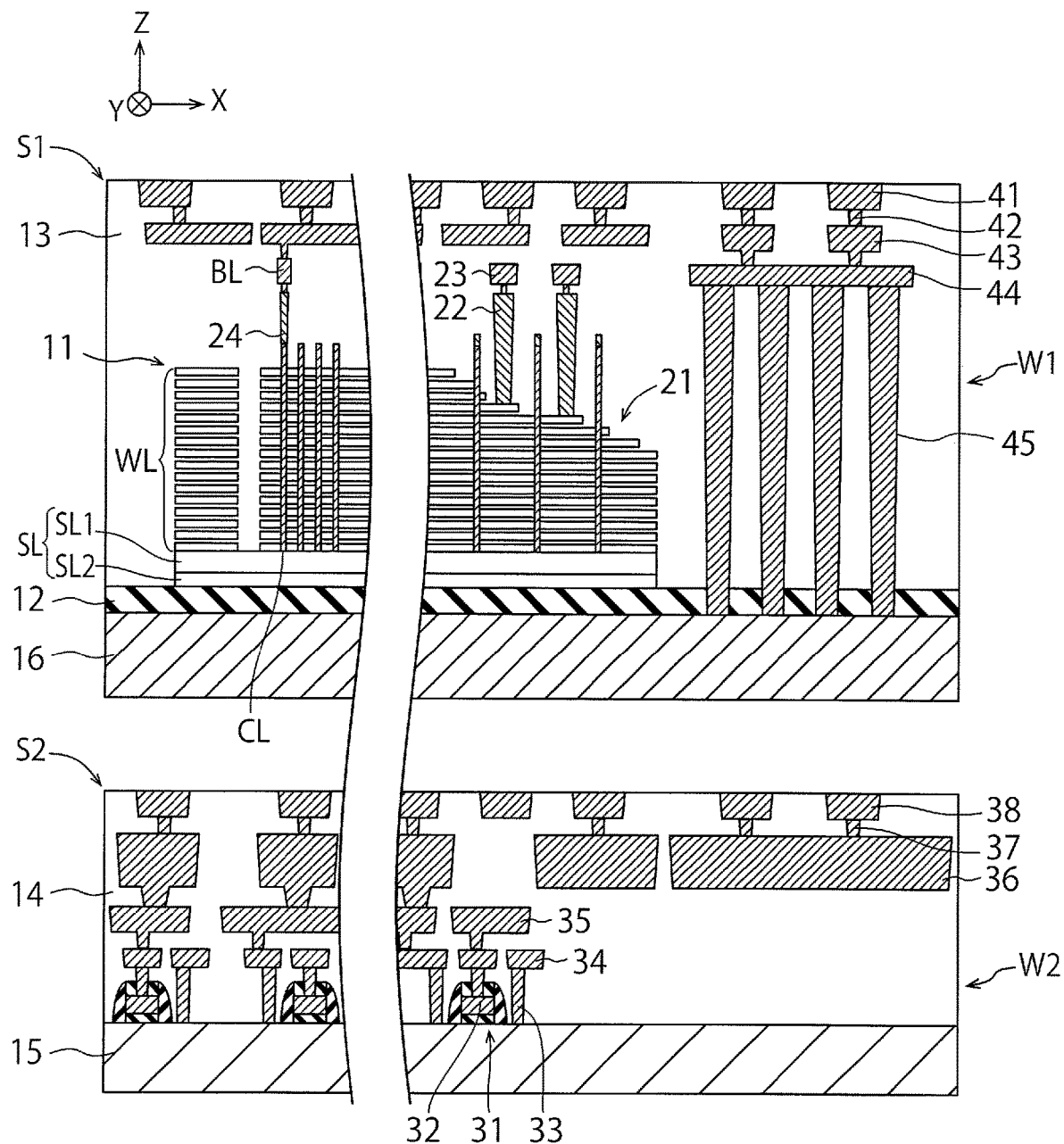
FIGS. 3 to 4 are sectional views showing a method of manufacturing the semiconductor device of the first embodiment.
Figure 4:
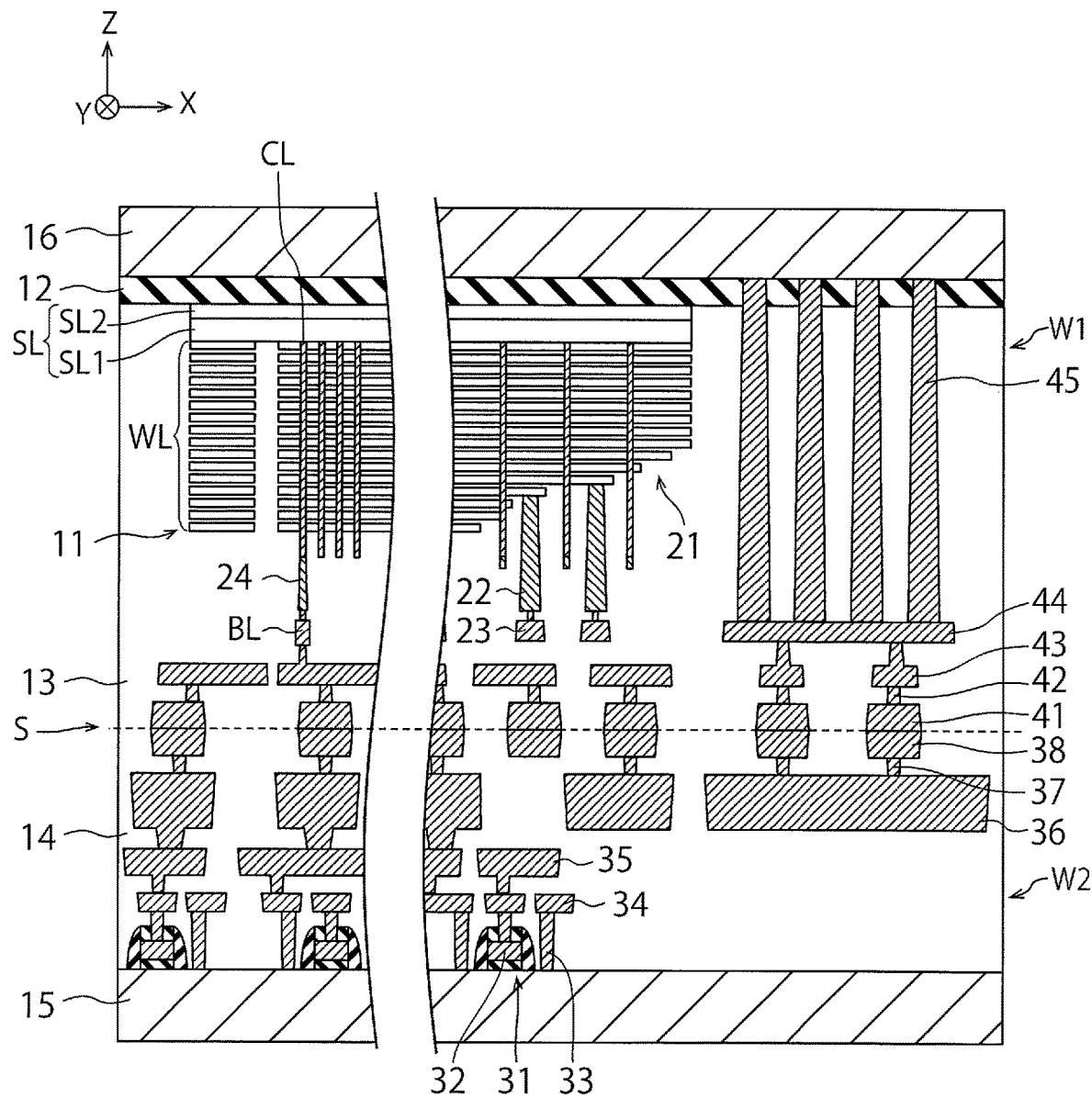

FIGS. 3 and 4 are sectional views showing a method of manufacturing the semiconductor device of the first embodiment.

FIG. 3 shows an array wafer W1 including a plurality of array chips 1 and a circuit wafer W2 including a plurality of circuit chips 2. The array wafer W1 is also called "memory wafer" and the circuit wafer W2 is also called "CMOS wafer".

It should be noted that the orientation of the array wafer W1 in FIG. 3 is reverse to the orientation of the array chip 1 in FIG. 1. In the present embodiment, semiconductor devices are manufactured by bonding the array wafer W1 and the circuit wafer W2 together. FIG. 3 shows the array wafer W1 before the orientation is reversed for the bonding, and FIG. 1 shows the array chip 1 after the reverse of the orientation for the bonding, the bonding, and dicing.

In FIG. 3, sign S1 denotes the upper face of the array wafer W1, and sign S2 denotes the upper face of the circuit wafer W2. It should be noted that the array wafer W1 includes a substrate 16 provided below the insulator 12. An example of the substrate 16 is a semiconductor substrate such as a silicon substrate.

In the present embodiment, first, as shown in FIG. 3, the memory cell array 11, the insulator 12, the inter layer dielectric 13, the step structure portion 21, the metal pads 41 and the like are formed on the substrate 16 of the array wafer W1, and the inter layer dielectric 14, the transistors 31, the metal pads 38 and the like are formed on the substrate 15 of the circuit wafer W2. For example, the via plugs 45, the interconnect layer 44, the interconnect layer 43, the via plugs 42 and the metal pads 41 are sequentially formed on the substrate 16. Moreover, the contact plugs 33, the interconnect layer 34, the interconnect layer 35, the interconnect layer 36, the via plugs 37 and the metal pads 38 are sequentially formed on the substrate 15. Next, as shown in FIG. 4, the array wafer W1 and the circuit wafer W2 are bonded together under mechanical pressure. Thereby, the inter layer dielectric 13 and the inter layer dielectric 14 are caused to adhere together. Next, the array wafer W1 and the circuit wafer W2 are annealed at 400° C. Thereby, the metal pads 41 and the metal pads 38 are joined together.

After that, after the substrate 15 is made into a thin film by CMP (Chemical Mechanical Polishing) and the substrate 16 is removed by CMP, the array wafer W1 and the circuit wafer W2 are cut into a plurality of chips. As above, the semiconductor device in FIG. 1 is manufactured. FIG. 1 shows the circuit chip 2 including the metal pads 38 and the inter layer dielectric 14, and the array chip 1 including the metal pads 41 and the inter layer dielectric 13 which are arranged on the metal pads 38 and the inter layer dielectric 14, respectively. The metal pad 46 and the passivation film 47 are formed on the insulator 12, for example, after the substrate 15 is made into a thin film and the substrate 16 is removed.

While in the present embodiment, the array wafer W1 and the circuit wafer W2 are bonded together, the array wafers W1 may be bonded together instead. The contents mentioned above with reference to FIGS. 1 to 4 and contents to be mentioned later with reference with FIGS. 5 to 20 can be also applied to bonding the array wafers W1 together.

Moreover, while FIG. 1 shows the boundary face between the inter layer dielectric 13 and the inter layer dielectric 14 and the boundary faces between the metal pads 41 and the metal pads 38, these boundary faces come not to be observed in general after the aforementioned annealing. Nevertheless, the positions of these boundary faces can be estimated, for example, by detecting the slopes of the lateral faces of the metal pads 41 and the lateral faces of the metal pads 38 or the positional displacements of the lateral faces of the metal pads 41 from the metal pads 38.

Moreover, the semiconductor device(s) of the present embodiment may be target(s) of trade(s) in the state of FIG. 1 after the cutting into a plurality of chips or may be target(s) of trade(s) in the state of FIG. 4 before the cutting into a plurality of chips. FIG. 1 shows the semiconductor device in the state of a chip and FIG. 4 shows the semiconductor device in the state of a wafer. In the present embodiment, from semiconductor devices in a form of one wafer (FIG. 4), semiconductor devices in a form of a plurality of chips (FIG. 1) are manufactured.

Figure 5:
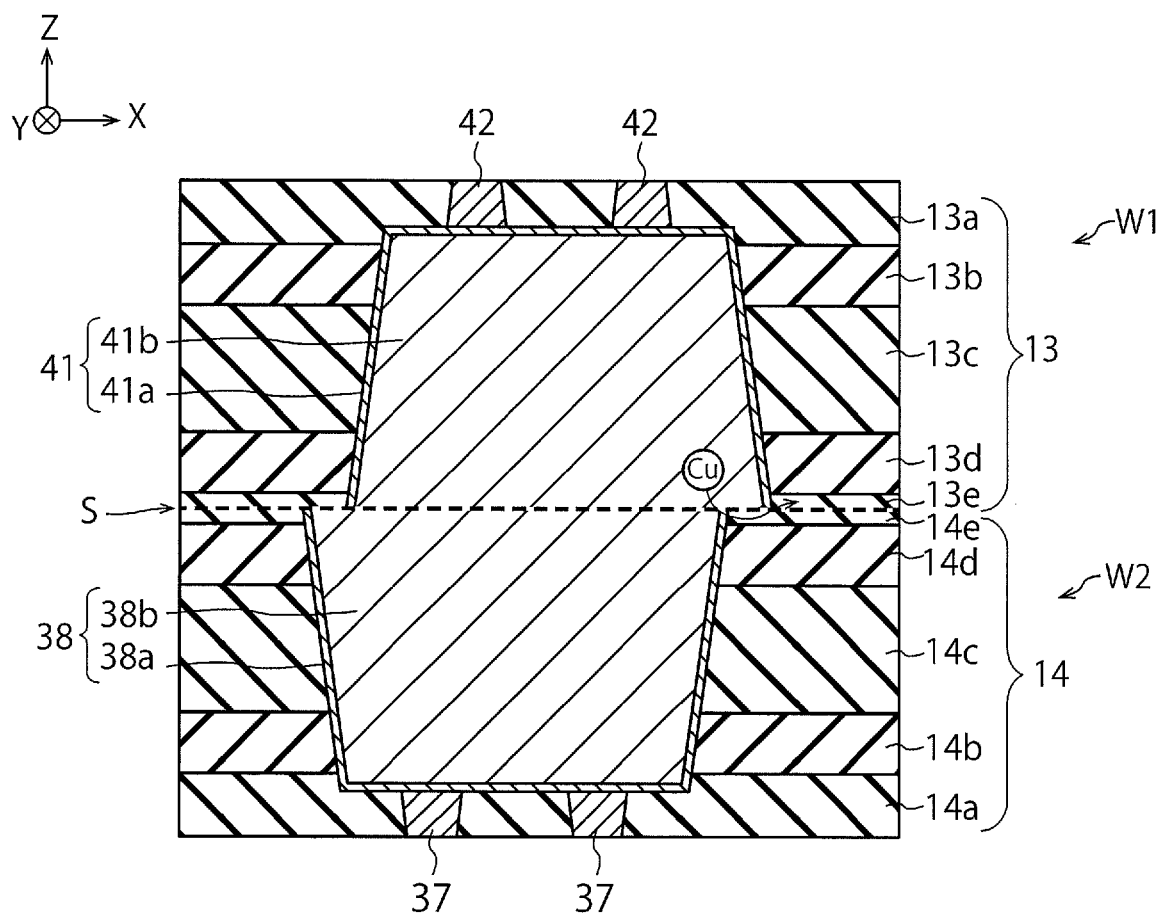
FIG. 5 is a sectional view showing a structure of a semiconductor device of a comparative example of the first embodiment.
Figure 6:
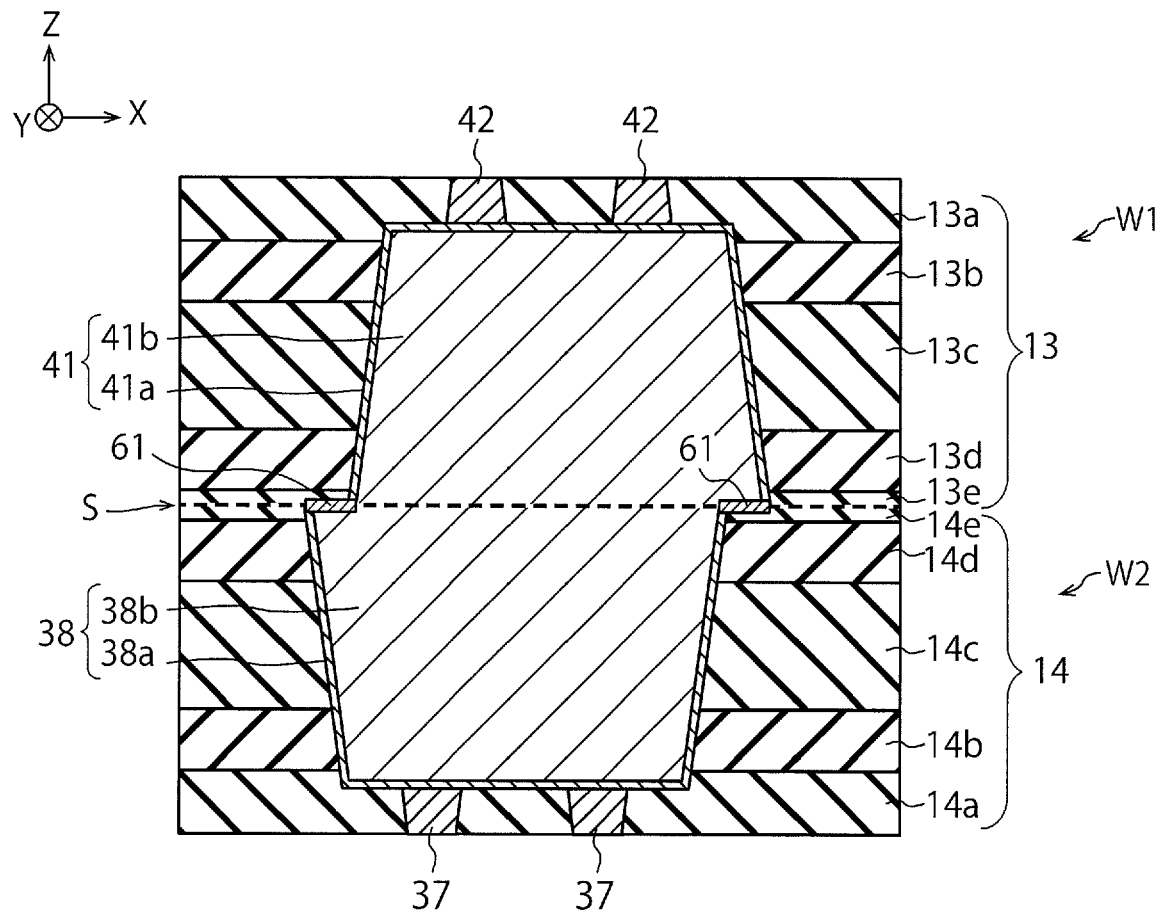
FIG. 6 is sectional views showing a structure of the semiconductor device of the first embodiment.

FIG. 5 is a sectional view showing a structure of a semiconductor device of a comparative example of the first embodiment. FIG. 6 is a sectional view showing a structure of a semiconductor device of the first embodiment. An example of differences between the semiconductor device shown in FIG. 5 and the semiconductor device shown in FIG. 6 is the presence or absence of a metal layer 61. The metal layer 61 is an example of a first portion.

Hereafter, a structure of the semiconductor device of the present embodiment is described with reference to FIG. 6, and after that, the semiconductor device of the present embodiment and the semiconductor device of the comparative example are compared with each other with reference to FIGS. 5 and 6.

In the present embodiment (FIG. 6), the inter layer dielectric 14 includes insulators 14e, 14d, 14c, 14b and 14a which are sequentially provided below the bonding face S, and the inter layer dielectric 13 includes insulators 13e, 13d, 13c, 13b and 13a which are sequentially provided on the bonding face S. Furthermore, the metal pad 38 includes a barrier metal layer 38a and a pad material layer 38b which are sequentially provided in the inter layer dielectric 14, and the metal pad 41 includes a barrier metal layer 41a and a pad material layer 41b which are sequentially provided in the inter layer dielectric 13. The semiconductor device of the present embodiment further includes the aforementioned metal layer 61.

An example of each of the insulators 14a, 14c, 14e, 13a, 13c and 13e is a SiO$_2$ film (silicon oxide film). An example of each of the insulators 14b and 13b is a SiN film (silicon nitride film). The insulators 14b and 13b of the present embodiment are used as etching stoppers, for example, when holes for burying the metal pads 38 and 41 therein are formed in the inter layer dielectrics 14 and 13, respectively, by etching. An example of each of the insulators 14d and 13d is a SiCN film (silicon carbide nitride film). The insulators 14d and 13d of the present embodiment are formed, for example, for preventing Cu atoms in the metal pads 38 and 41 from diffusing into the inter layer dielectrics 14 and 13, respectively. The insulators 14d and 13d are examples of a third film and a fourth film, respectively. Moreover, the insulators 14e and 13e are examples of a first film and a second film, respectively.

The insulators 14e and 13e of the present embodiment are native oxidized films formed through natural oxidation of the insulators 14d and 13d, respectively, before the array wafer W1 and the circuit wafer W2 are bonded together. Therefore, the lower face of the insulator 14e of the present embodiment is in contact with the upper face of the insulator 14d, and the upper face of the insulator 13e of the present embodiment is in contact with the lower face of insulator 13e. Moreover, the upper face of the insulator 14e of the present embodiment is in contact with the lower face of the insulator 13e. The insulators 14e and 13e may be formed due to another cause other than the natural oxidation, and, for example, may be formed by CMP or plasma processing on the surfaces of the inter layer dielectrics 14 and 13.

The barrier metal layer 38a is formed on a lateral face and a lower face (bottom face) of the inter layer dielectric 14 and is in contact with the lateral face and the lower face of the inter layer dielectric 14. The pad material layer 38b is formed on the lateral face and the lower face of the inter layer dielectric 14 via the barrier metal layer 38a. Likewise, the barrier metal layer 41a is formed on a lateral face and an upper face (bottom face) of the inter layer dielectric 13 and is in contact with the lateral face and the upper face of the inter layer dielectric 13. The pad material layer 41b is formed on the lateral face and the upper face of the inter layer dielectric 13 via the barrier metal layer 41a. The barrier metal layers 38a and 41a are examples of a first layer and a third layer, respectively. The pad material layers 38b and 41b are examples of a second layer and a fourth layer, respectively.

An example of each of the barrier metal layers 38a and 41a is a metal layer including Ti (titanium), Al (aluminum) or Mn (manganese) and is herein a Ti layer. The barrier metal layers 38a and 41a of the present embodiment are formed, for example, for preventing Cu atoms in the metal pads 38 and 41 from diffusing into the inter layer dielectrics 14 and 13, respectively. Each of the barrier metal layers 38a and 41a may be a metal compound layer including a metal element and a non-metal element, and, for example, may be a metal oxide film or a metal nitride film. Moreover, each of the barrier metal layers 38a and 41a may be an alloy layer including two kinds or more of metal elements. An example of each of the pad material layers 38b and 41b is a metal layer including Cu and is herein a Cu layer. Each of the pad material layers 38b and 41b may be a metal layer other than the Cu layer.

The metal pad 38 and the metal pad 41 of the present embodiment have the same planar shapes. These planar shapes are herein squares or rectangles having two sides extending in the X-direction and two sides extending in the Y-direction. Therefore, the width of the metal pad 41 of the present embodiment in the X-direction and the width of the metal pad 41 in the Y-direction are the same as the width of the metal pad 38 in the X-direction and the width of the metal pad 38 in the Y-direction, respectively.

Hence, if the metal pad 41 is arranged directly above the metal pad 38, the lower face of the metal pad 41 is to be in contact only with the upper face of the metal pad 38, and it is not to be in contact with the upper faces of the layers other than the metal pad 38. Likewise, the upper face of the metal pad 38 is to be in contact only with the lower face of the metal pad 41, and it is not to be in contact with the lower faces of the layers other than the metal pad 41.

However, the metal pad 41 of the present embodiment is not arranged directly above the metal pad 38. Therefore, the lower face of the metal pad 41 of the present embodiment is not only in contact with the upper face of the metal pad 38 but also provided on an upper face of the inter layer dielectric 14. Likewise, the upper face of the metal pad 38 of the present embodiment is not only in contact with the lower face of the metal pad 41 but also provided below a lower face of the inter layer dielectric 13. Further, in the present embodiment, the metal layer 61 is provided between the upper face of the metal pad 38 and the lower face of the inter layer dielectric 13 and between the lower face of the metal pad 41 and the upper face of the inter layer dielectric 14.

For example, the metal layer 61 includes a metal element same as a metal element included in the barrier metal layer 38a, 41a. An example of this metal element is Ti, Al, or Mn. The metal layer 61 may further include oxygen. In the present embodiment, the barrier metal layers 38a and 41a are Ti layers, and the metal layer 61 is a TiO$_x$ (titanium oxide) layer.

The metal layer 61 of the present embodiment is formed by allowing Ti atoms in the barrier metal layers 38a and 41a to diffuse into an interface between the pad material layer 38b and the insulator 13e and an interface between the pad material layer 41b and the insulator 14e, and is self-aligned at the positions of these interfaces. The metal layer 61 of the present embodiment is a TiO$_x$ layer including Ti atoms originated from the barrier metal layers 38a and 41a and O atoms originated from the insulators 14e and 13e. Therefore, the lower face of the metal layer 61 of the present embodiment is in contact with an upper face of the insulator 14e and an upper face of the pad material layer 38b, and the upper face of the metal layer 61 of the present embodiment is in contact with a lower face of the insulator 13e and a lower face of the pad material layer 41b.

The metal layer 61 may include a metal element same as a metal element included only in any one of the barrier metal layer 38a and the barrier metal layer 41a. For example, when only the barrier metal layer 38a of the barrier metal layers 38a and 41a includes Ti atoms and the metal layer 61 is formed of Ti atoms diffusing from the barrier metal layer 38a, the barrier metal layer 38a and the metal layer 61 include Ti, and the barrier metal layer 41a does not include Ti.

Moreover, the metal layer 61 of the present embodiment may be formed in a thickness or a size which is too small to such an extent that it cannot be called a layer, between the metal pad 38 and the inter layer dielectric 13 and/or between the metal pad 41 and the inter layer dielectric 14. Further details of the process of allowing the metal layer 61 of the present embodiment to form are mentioned later.

Next, the semiconductor device of the present embodiment and the semiconductor device of the comparative example are compared with each other with reference to FIGS. 5 and 6.

In the comparative example (FIG. 5), the barrier metal layers 38a and 41a are Ta (tantalum) layers, not Ti layers. Ta atoms are hardly allowed to diffuse as compared with Ti atoms. Therefore, in the comparative example, the metal layer 61 is not formed between the metal pad 38 and the inter layer dielectric 13 or between the metal pad 41 and the inter layer dielectric 14.

Moreover, in comparative example, the insulators 14e and 13e (SiO$_2$ films) are formed between the insulators 14d and 13d (SiCN films) similarly to the present embodiment. A SiO$_2$ film has a less action of preventing Cu atoms from diffusing as compared with a SiCN film. Therefore, in the comparative example, Cu atoms in the metal pads 38 and 41 result in their diffusion into the inter layer dielectrics 14 and 13 via the insulators 14e and 13e. Such diffusion of Cu atoms has a possibility of occurring, for example, in an annealing step in manufacturing semiconductor devices. The Cu atoms diffusing into the inter layer dielectrics 14 and 13 cause leak current to arise, for example, between the metal pads 38, between the metal pads 41, between the metal pad 38 and the metal pad 41, and/or between the similar portions.

The diffusion of the Cu atoms into the inter layer dielectrics 14 and 13 does not almost cause a problem as long as the metal pads 38 and 41 have the same planar shapes and the metal pad 41 is arranged directly above the metal pad 38. This is because in this case, the lower face of the metal pad 41 is to be in contact only with the upper face of the metal pad 38 and the upper face of the metal pad 38 is also to be in contact only with the lower face of the metal pad 41.

Nevertheless, there is a case where an error arises in positioning of the metal pad 38 and the metal pad 41 when the array wafer W1 and the circuit wafer W2 are bonded together. In this case, the metal pad 41 is not arranged directly above the metal pad 38, the lower face of the metal pad 41 is to be in contact also with the upper face of the inter layer dielectric 14, and the upper face of the metal pad 38 is to be in contact also with the lower face of the inter layer dielectric 13.

Even in this case, when the upper face of the inter layer dielectric 14 is formed of the insulator 14d (SiCN film) and the lower face of the inter layer dielectric 13 is formed of the insulator 13d (SiCN film), Cu atoms can be restrained from diffusing into the inter layer dielectrics 14 and 13. This is because SiCN films largely have an action of preventing Cu atoms from diffusing. However, when the inter layer dielectrics 14 and 13 come to include the insulators 14e and 13e (SiO$_2$ films) through natural oxidation or the like, Cu atoms in the metal pads 38 and 41 result in their diffusion into the inter layer dielectrics 14 and 13 via the insulators 14e and 13e.

On the other hand, in the present embodiment (FIG. 6), the barrier metal layers 38a are 41a are Ti layers. Ti atoms tend to be allowed to diffuse more than Ta atoms. Therefore, in the present embodiment, the metal layer 61 is formed between the metal pad 38 and the inter layer dielectric 13 and/or between the metal pad 41 and the inter layer dielectric 14. Hence, the present embodiment makes it possible to restrain, with the metal layer 61, Cu atoms from diffusing from the metal pads 38 and 41 into the inter layer dielectrics 14 and 13, even when the metal pad 41 is not arranged directly above the metal pad 38 and the inter layer dielectrics 14 and 13 include the insulators 14e and 13e (SiO$_2$ films) due to natural oxidation or the like. Such diffusion of Ti atoms which gives the metal layer 61 occurs, for example, in an annealing step in manufacturing semiconductor devices.

Using Ti layers as the barrier metal layers 38a and 41a has an advantage that the TiO$_x$ layer (metal layer 61) has high barrier performance and an advantage that it costs low to form the Ti layers. Such a barrier effect can be also obtained in the case where AlO$_x$ layers are formed using Al layers and in the case where MnO$_x$ layers are formed using Mn layers.

The structure, in the present embodiment, in which the metal pad 41 is not directly above the metal pad 38 may be caused by an error in positioning of the metal pad 38 and the metal pad 41 or may be caused to occur on purpose in manufacturing semiconductor devices.

FIGS. 7 to 11 are sectional views showing a method of manufacturing the semiconductor device of the first embodiment. The method shown in FIGS. 7 to 11 corresponds to a specific example of the method shown in FIGS. 3 to 4.

Figure 7:
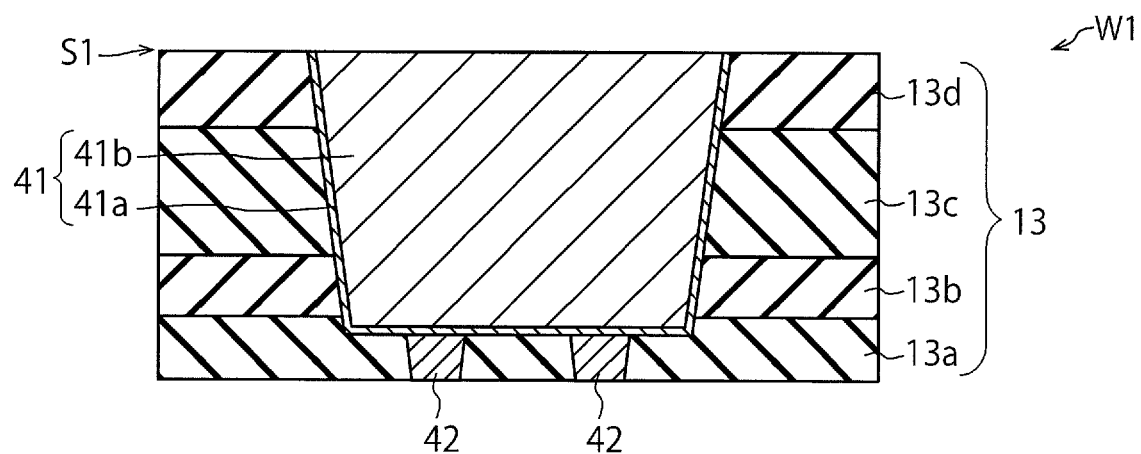
FIGS. 7 to 11 are sectional views showing a method of manufacturing the semiconductor device of the first embodiment.
Figure 7:
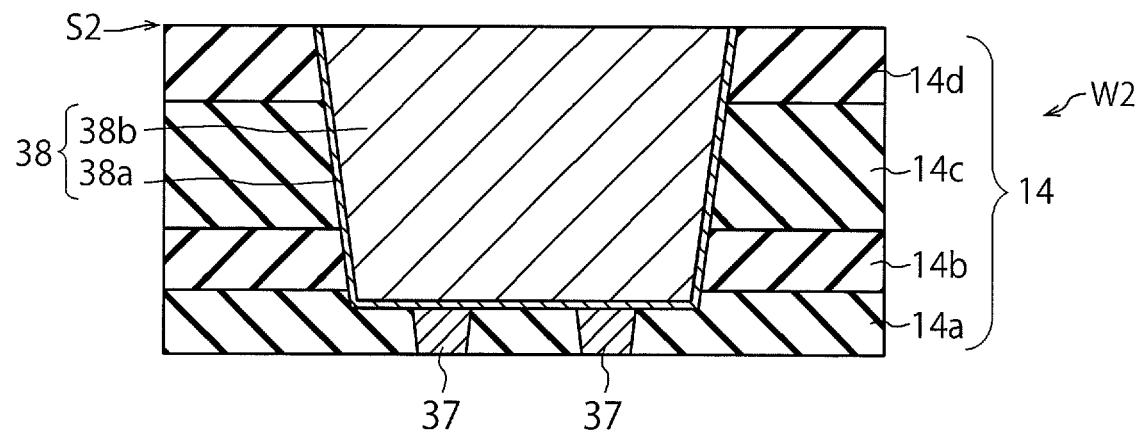

First, the array wafer W1 and the circuit wafer W2 are processed into the structures shown in FIG. 7. Specifically, the insulator 13a is formed above the substrate 16 (see FIG. 3), the via plugs 42 are formed in the insulator 13a, the insulators 13b, 13c and 13d are sequentially formed on the insulator 13a and the via plugs 42, and the barrier metal layer 41a and the pad material layer 41b are sequentially formed in the insulators 13b, 13c and 13d. Likewise, the insulator 14a is formed above the substrate 15 (see FIG. 3), the via plugs 37 are formed in the insulator 14a, the insulators 14b, 14c and 14d are sequentially formed on the insulator 14a and the via plugs 37, and the barrier metal layer 38a and the pad material layer 38b are sequentially formed in the insulators 14b, 14c and 14d. Consequently, the metal pads 41 and 38 are formed in the inter layer dielectrics 13 and 14, respectively.

Figure 8:
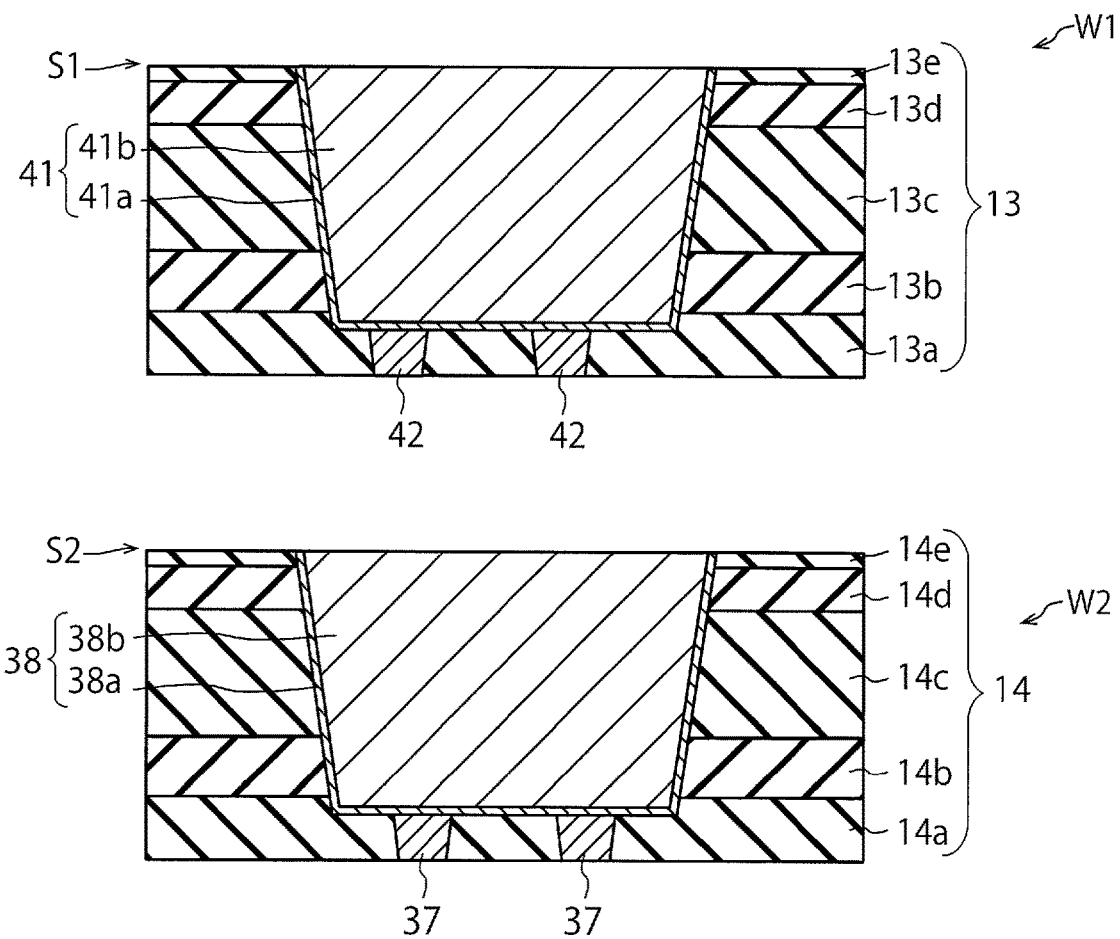

Next, the insulators 13e and 14e are formed on the surfaces of the insulators 13d and 14d, respectively, through oxidation (FIG. 8). The insulators 13e and 14e are formed, for example, through natural oxidation.

Figure 9:
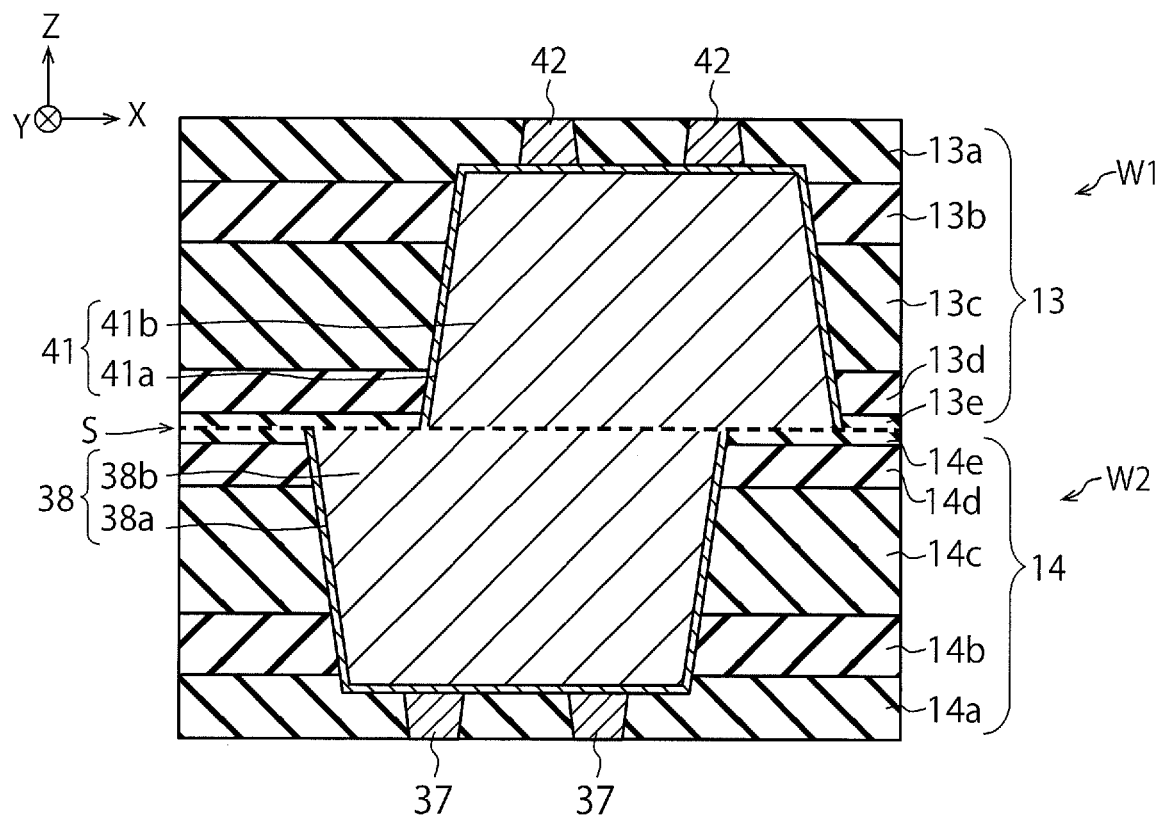

Next, the array wafer W1 and the circuit wafer W2 are bonded together under mechanical pressure such that the metal pad 41 is arranged on the metal pad 38 and the inter layer dielectric 13 is arranged on the inter layer dielectric 14 (FIG. 9). Thereby, the inter layer dielectric 13 and the inter layer dielectric 14 are caused to adhere together. In FIG. 9, there arises an error in positioning of the metal pad 38 and the metal pad 41, and a portion of the upper face of the metal pad 38 and a portion of the lower face of the metal pad 41 are in contact with each other.

Figure 10:
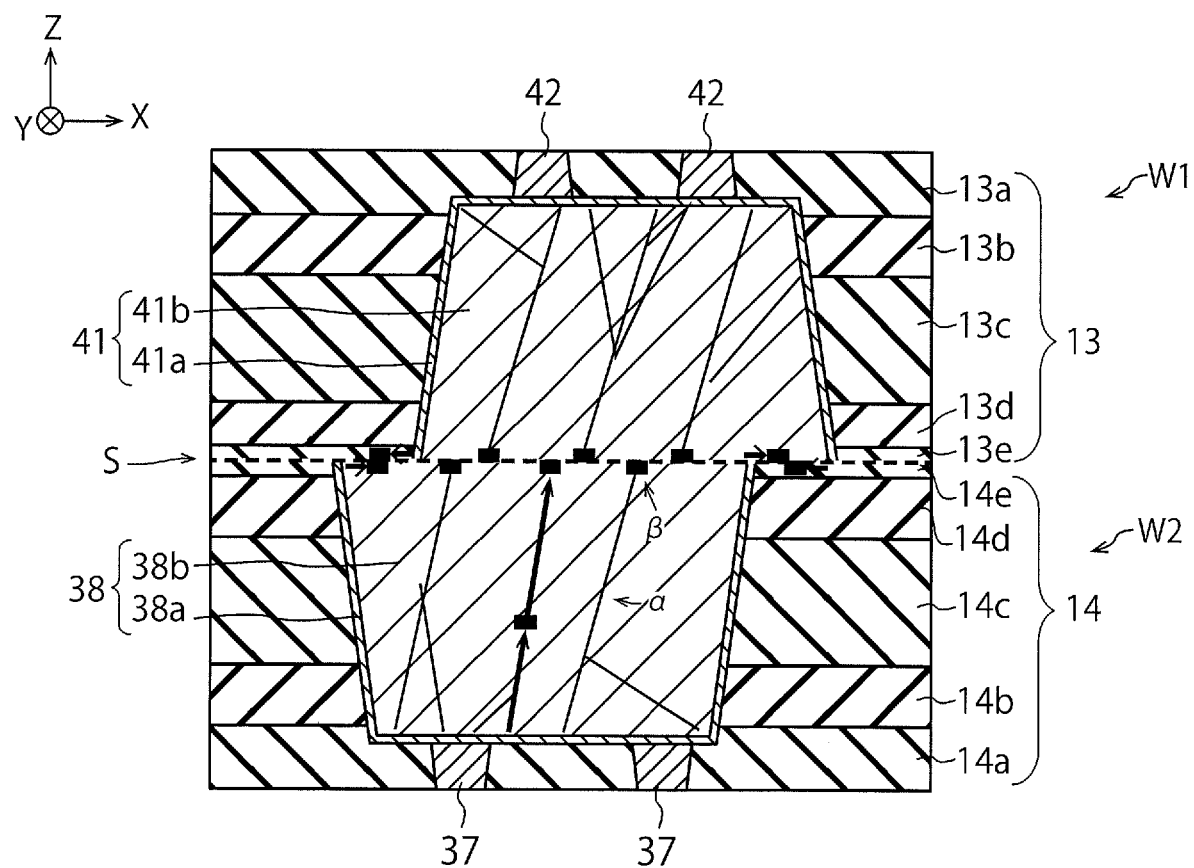

Next, the array wafer W1 and the circuit wafer W2 are annealed (FIG. 10). Thereby, the metal pad 41 and the metal pad 38 are joined together. FIG. 10 further shows grain boundaries a between crystal grains in the pad material layers 38b and 41b, and Ti atom groups β diffusing along the grain boundaries a and the bonding face S. In the present embodiment, Ti atoms diffuse from the barrier metal layers 38a and 41a by annealing in the step shown in FIG. 10.

Figure 11:
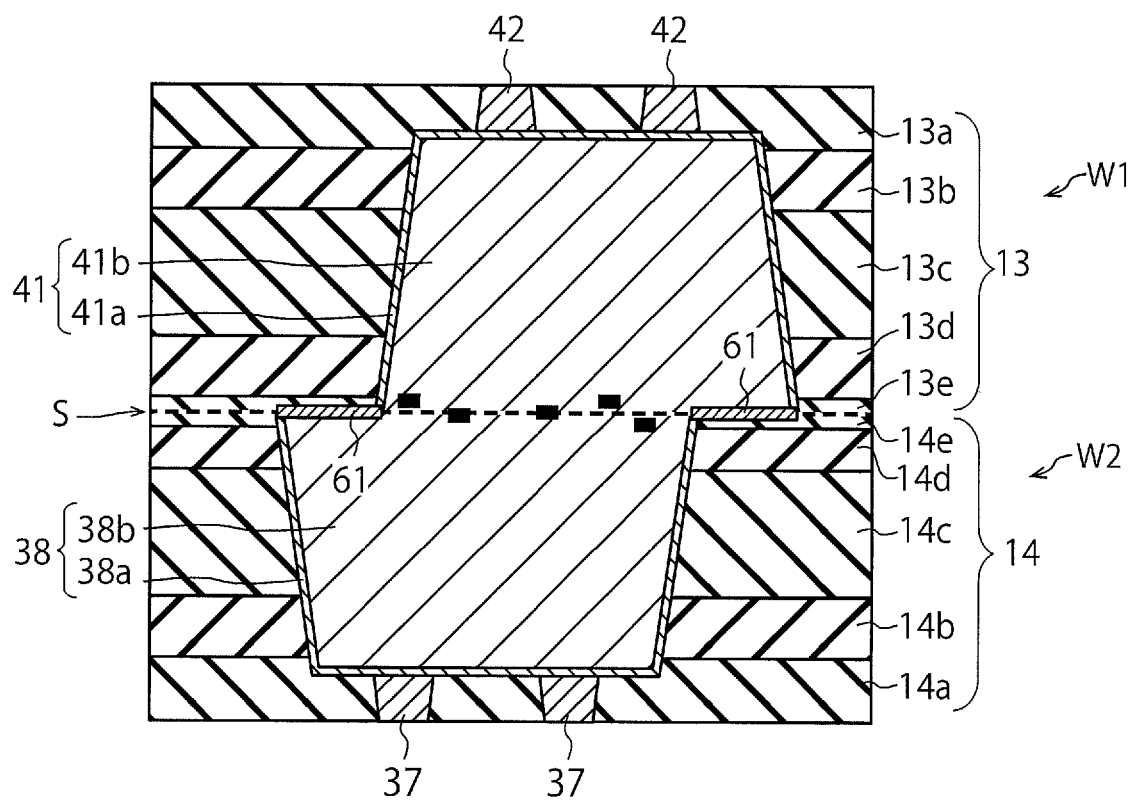

Consequently, Ti atoms in the barrier metal layers 38a and 41a are allowed to diffuse into the interface between the pad material layer 38b and the insulator 13e and the interface between the pad material layer 41b and the insulator 14e, and the metal layer 61 is self-aligned at the positions of these interfaces (FIG. 11). Specifically, the Ti atoms having been allowed to diffuse into the interfaces from the barrier metal layers 38a and 41a react with O atoms in the insulators 14e and 13e to form a TiO$_x$ layer as the metal layer 61. Therefore, the present embodiment makes it possible to restrain, with the metal layer 61, Cu atoms from diffusing from the metal pads 38 and 41 into the inter layer dielectrics 14 and 13.

As above, the semiconductor device in FIG. 6 is manufactured. After that, after the substrate 15 is made into a thin film by CMP and the substrate 16 is removed by CMP, the array wafer W1 and the circuit wafer W2 are cut into a plurality of chips. As above, the semiconductor device in FIG. 1 is manufactured.

As above, the semiconductor device of the present embodiment includes the metal layer 61 including the metal element same as the metal element included in the barrier metal layers 38a and 41a, between the upper face of the metal pad 38 and the lower face of the inter layer dielectric 13 and/or between the lower face of the metal pad 41 and the upper face of the inter layer dielectric 14. Therefore, the present embodiment makes it possible to restrain metal atoms (for example, Cu atoms) from diffusing from the pad material layers 38b and 41b into the insulators 14e and 13e and to afford the similar action and makes it possible to form the preferable metal pads 38 and 41.

Second Embodiment

Figure 12:
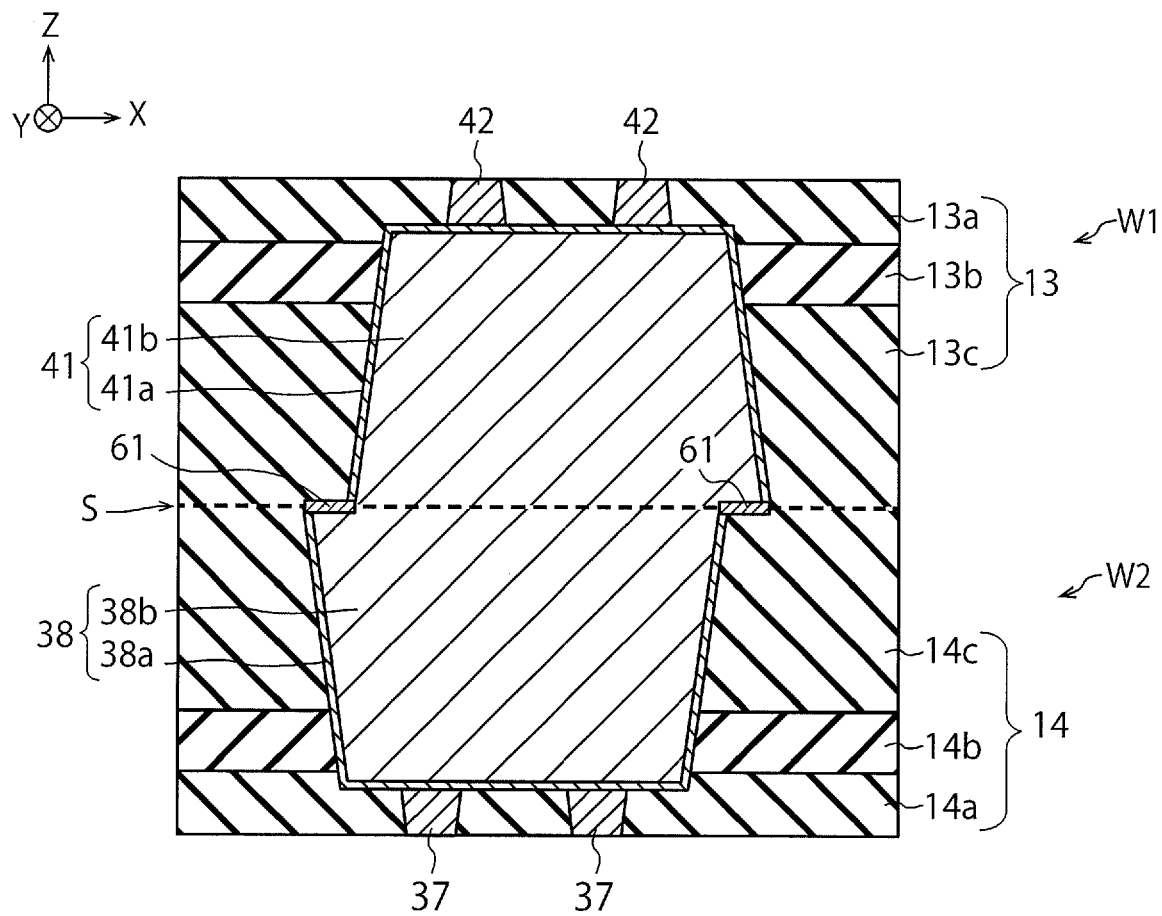
FIG. 12 is a sectional view showing a structure of a semiconductor device of a second embodiment.

FIG. 12 is a sectional view showing a structure of a semiconductor device of a second embodiment.

The inter layer dielectrics 13 and 14 of the present embodiment do not include the insulator 13d or 14d (SiCN film), and consequently, also do not include the insulator 13e or 14e (SiO$_2$ film). In the present embodiment, the insulator 13c (SiO$_2$ film) in the inter layer dielectric 13 and the insulator 14c (SiO$_2$ film) in the inter layer dielectric 14 are in contact with each other on the bonding face S.

Also the semiconductor device of the present embodiment includes the metal layer 61. The metal layer 61 of the present embodiment is formed through reaction of Ti atoms allowed to diffuse from the barrier metal layers 38a and 41a with O atoms in the insulators 14c and 13c.

The present embodiment makes it possible to eliminate the labor and time for forming the insulators 13d and 14d. Moreover, the present embodiment makes it possible to make the surfaces of the inter layer dielectrics 13 and 14 flat readily by CMP since the insulators 13d and 14d do not exist in the vicinities of the surfaces of the inter layer dielectrics 13 and 14. On the other hand, the first embodiment makes it possible to restrain, not only with the metal layer 61 but also with the insulators 13d and 14d, Cu atoms from diffusing.

FIGS. 13 to 16 are sectional views showing a method of manufacturing the semiconductor device of the second embodiment. The method shown in FIGS. 13 to 16 corresponds to a specific example of the method shown in FIGS. 3 and 4.

Figure 13:
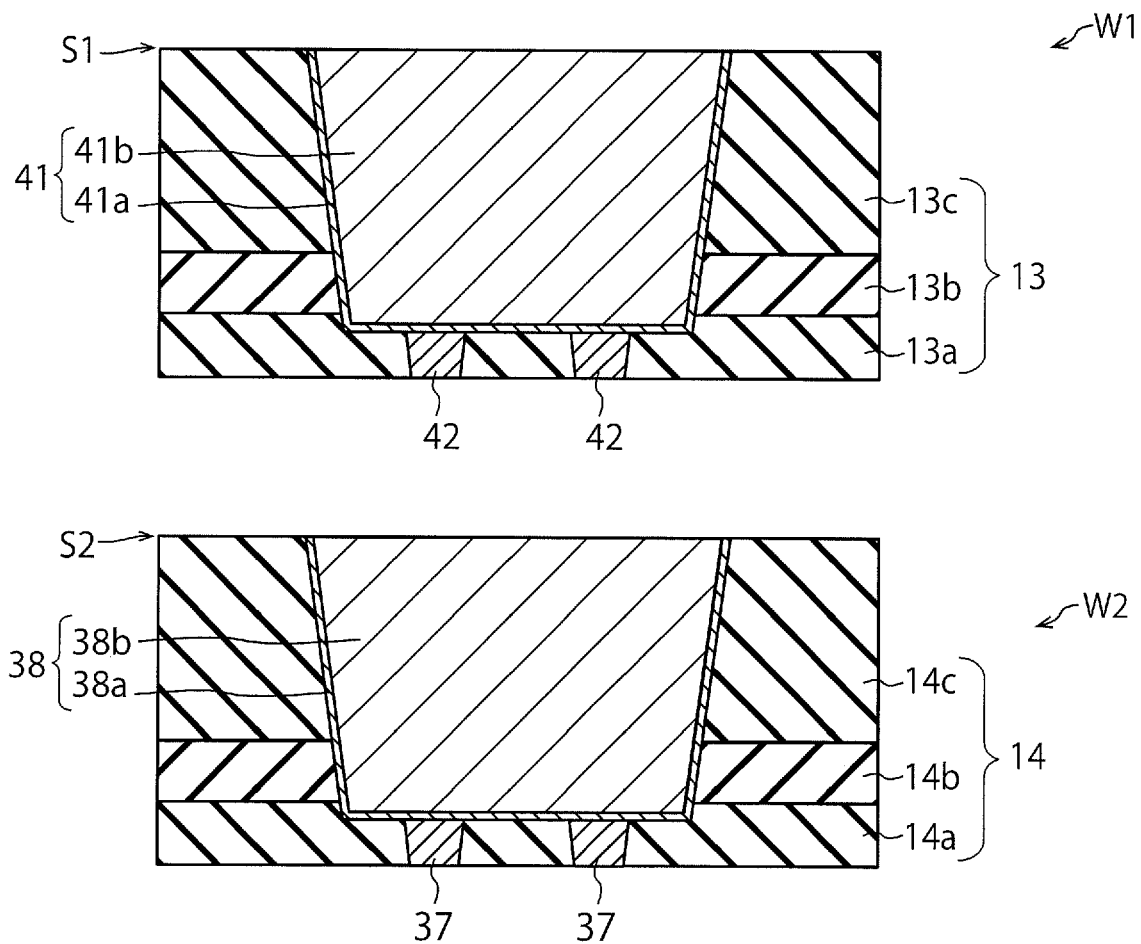
FIGS. 13 to 16 are sectional views showing a method of manufacturing the semiconductor device of the second embodiment.

First, the array wafer W1 and the circuit wafer W2 are processed into the structures shown in FIG. 13. Specifically, the insulator 13a is formed above the substrate 16 (see FIG. 3), the via plugs 42 are formed in the insulator 13a, the insulators 13b and 13c are sequentially formed on the insulator 13a and the via plugs 42, and the barrier metal layer 41a and the pad material layer 41b are sequentially formed in the insulators 13b and 13c. Likewise, the insulator 14a is formed above the substrate 15 (see FIG. 3), the via plugs 37 are formed in the insulator 14a, the insulators 14b and 14c are sequentially formed on the insulator 14a and the via plugs 37, and the barrier metal layer 38a and the pad material layer 38b are sequentially formed in the insulators 14b and 14c. Consequently, the metal pads 41 and 38 are formed in the inter layer dielectrics 13 and 14, respectively.

Figure 14:
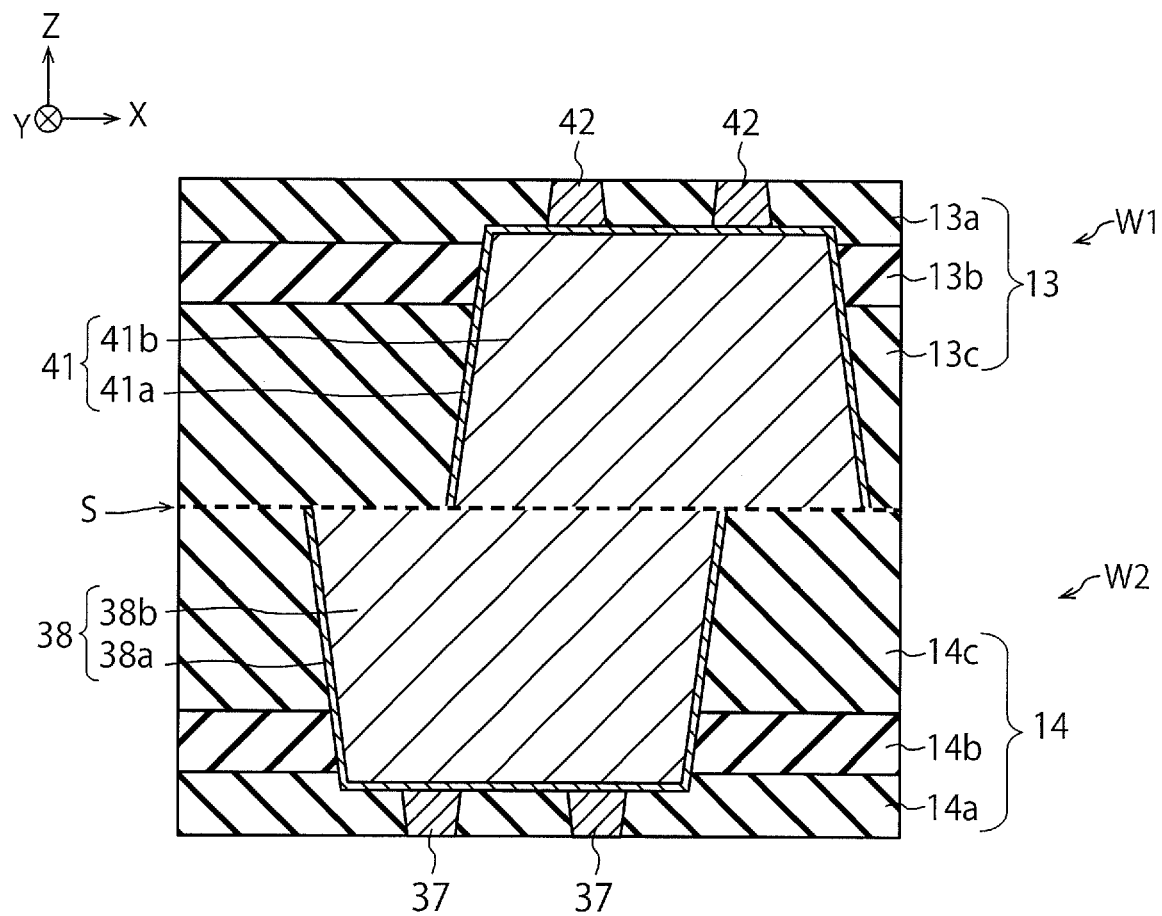

Next, the array wafer W1 and the circuit wafer W2 are bonded together under mechanical pressure such that the metal pad 41 is arranged on the metal pad 38 and the inter layer dielectric 13 is arranged on the inter layer dielectric 14 (FIG. 14). Thereby, the inter layer dielectric 13 and the inter layer dielectric 14 are caused to adhere together. In FIG. 14, there arises an error in positioning of the metal pad 38 and the metal pad 41, and a portion of the upper face of the metal pad 38 and a portion of the lower face of the metal pad 41 are in contact with each other.

Figure 15:
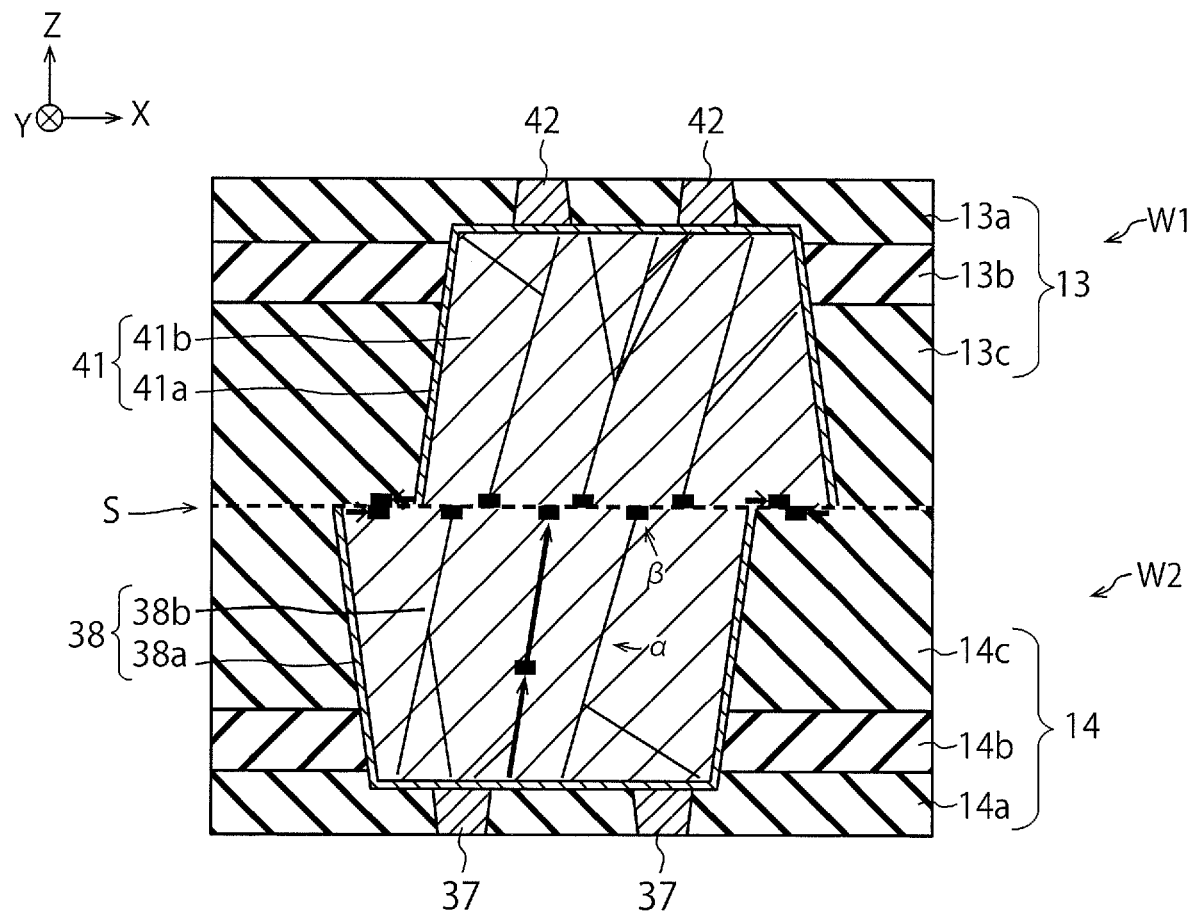

Next, the array wafer W1 and the circuit wafer W2 are annealed (FIG. 15). Thereby, the metal pad 41 and the metal pad 38 are joined together. FIG. 15 further shows grain boundaries a between crystal grains in the pad material layers 38b and 41b, and Ti atom groups β diffusing along the grain boundaries a and the bonding face S. In the present embodiment, Ti atoms diffuse from the barrier metal layers 38a and 41a by annealing in the step shown in FIG. 15.

Figure 16:
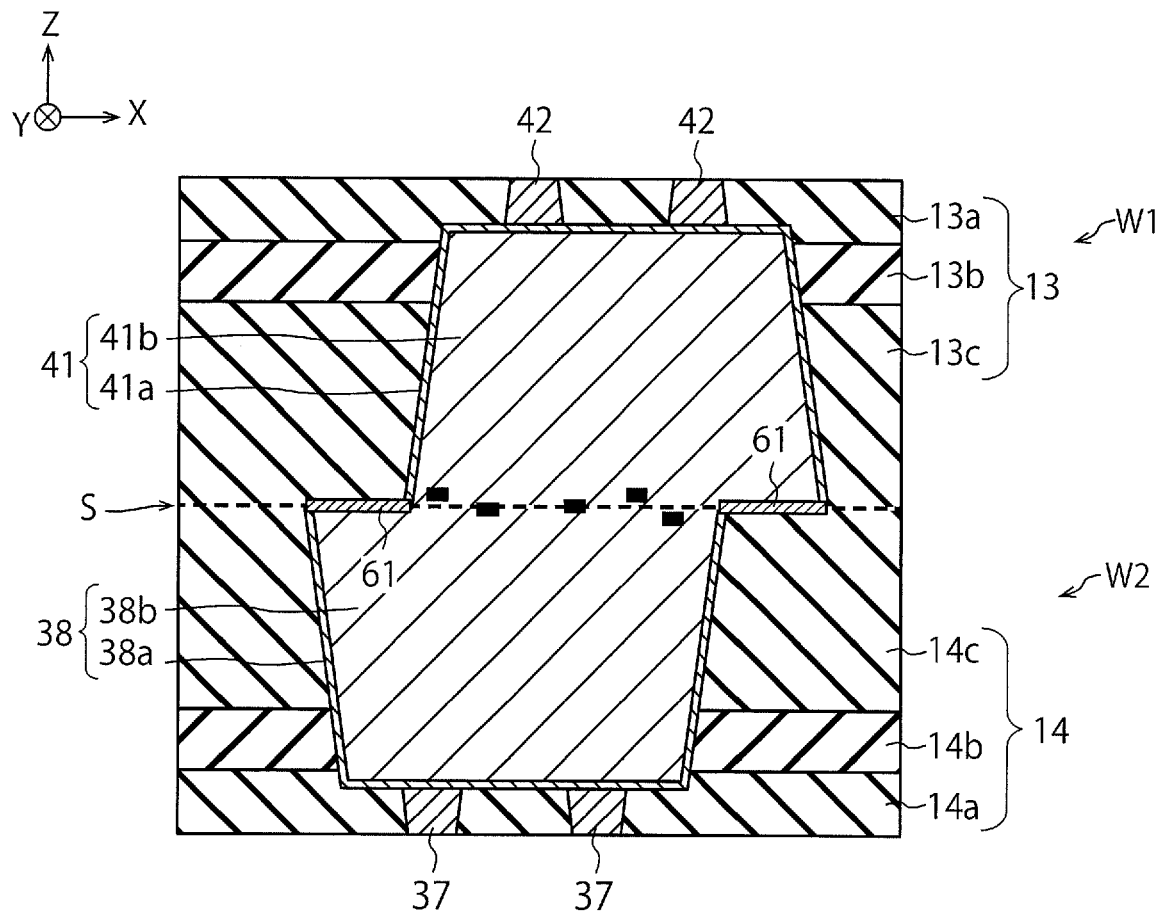

Consequently, Ti atoms in the barrier metal layers 38a and 41a are allowed to diffuse into the interface between the pad material layer 38b and the insulator 13c and the interface between the pad material layer 41b and the insulator 14c, and the metal layer 61 is self-aligned at the positions of these interfaces (FIG. 16). Specifically, the Ti atoms having been allowed to diffuse into the interfaces from the barrier metal layers 38a and 41a react with O atoms in the insulators 14c and 13c to form a $TiO_x$ layer as the metal layer 61. Therefore, the present embodiment makes it possible to restrain, with the metal layer 61, Cu atoms from diffusing from the metal pads 38 and 41 into the inter layer dielectrics 14 and 13.

As above, the semiconductor device in FIG. 12 is manufactured. After that, after the substrate 15 is made into a thin film by CMP and the substrate 16 is removed by CMP, the array wafer W1 and the circuit wafer W2 are cut into a plurality of chips. As above, the semiconductor device in FIG. 1 is manufactured.

As above, the semiconductor device of the present embodiment includes the metal layer 61 including the metal element same as the metal element included in the barrier metal layer 38a and 41a, between the upper face of the metal pad 38 and the lower face of the inter layer dielectric 13 and/or between the lower face of the metal pad 41 and the upper face of the inter layer dielectric 14. Therefore, the present embodiment makes it possible to restrain metal atoms (for example, Cu atoms) from diffusing from the pad material layers 38b and 41b into the insulators 14c and 13c and to do the similar action and makes it possible to form the preferable metal pads 38 and 41.

Third Embodiment

Figure 17:
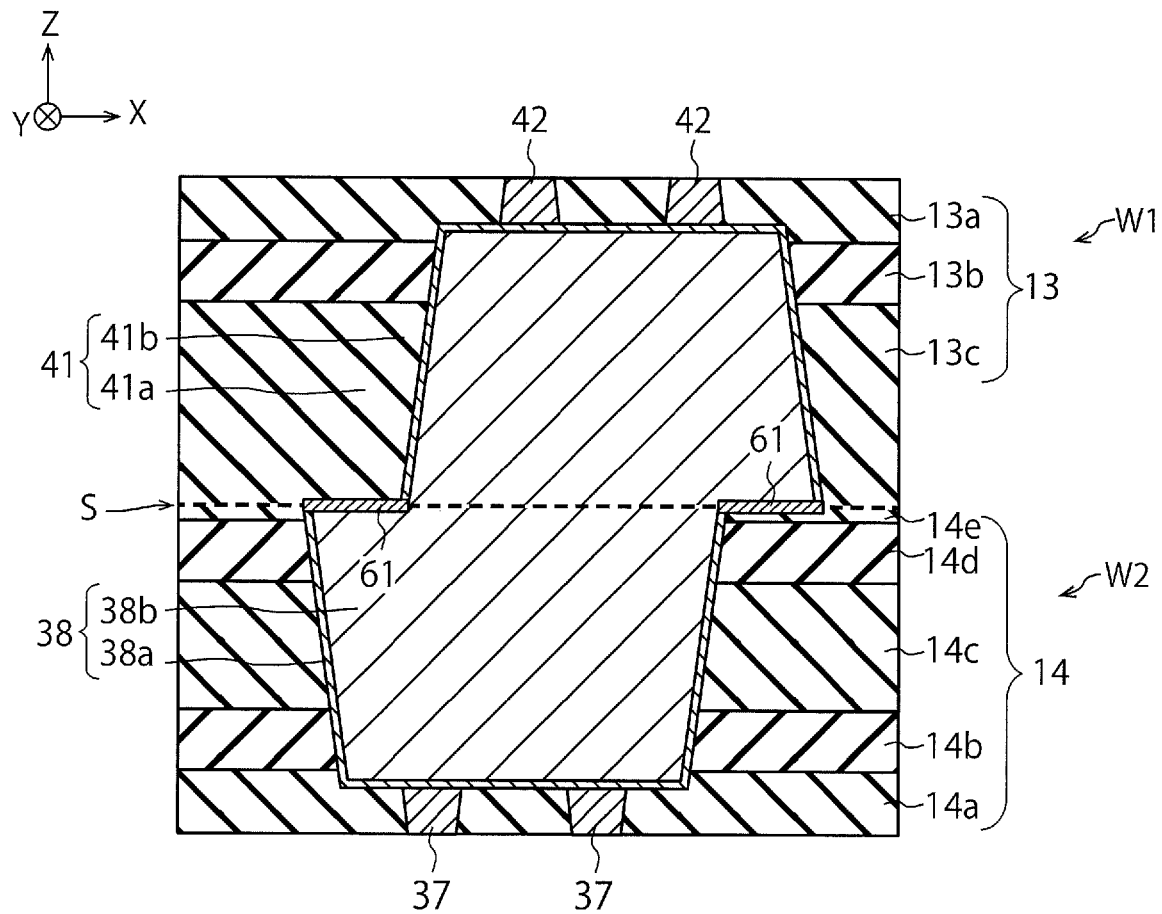
FIG. 17 is a sectional view showing a structure of a semiconductor device of a third embodiment.

FIG. 17 is a sectional view showing a structure of a semiconductor device of a third embodiment.

The inter layer dielectric 13 of the present embodiment does not include the insulator 13d (SiCN film), and consequently, also does not include the insulator 13e ($SiO_2$ film). On the other hand, the inter layer dielectric 14 of the present embodiment includes the insulator 14d (SiCN film), and consequently, also includes the insulator 14e ($SiO_2$ film). In the present embodiment, the insulator 13c ($SiO_2$ film) in the inter layer dielectric 13 and the insulator 14e ($SiO_2$ film) in the inter layer dielectric 14 are in contact with each other on the bonding face S.

Also the semiconductor device of the present embodiment includes the metal layer 61. The metal layer 61 of the present embodiment is formed through reaction of Ti atoms allowed to diffuse from the barrier metal layers 38a and 41a with O atoms in the insulators 14e and 13c.

The present embodiment makes it possible to enjoy the advantages similar to those in the first embodiment on the inter layer dielectric 14 and makes it possible to enjoy the advantages similar to those in the second embodiment on the inter layer dielectric 13. The semiconductor device of the present embodiment can be manufactured, for example, by applying the method shown in FIGS. 13 to 16 to the array wafer W1 and applying the method shown in FIGS. 7 to 11 to the circuit wafer W2.

In the semiconductor device of the present embodiment, the inter layer dielectric 13 may include the insulators 13d and 13e and the inter layer dielectric 14 may come not to include the insulator 14d or 14e.

Fourth Embodiment

Figure 18:
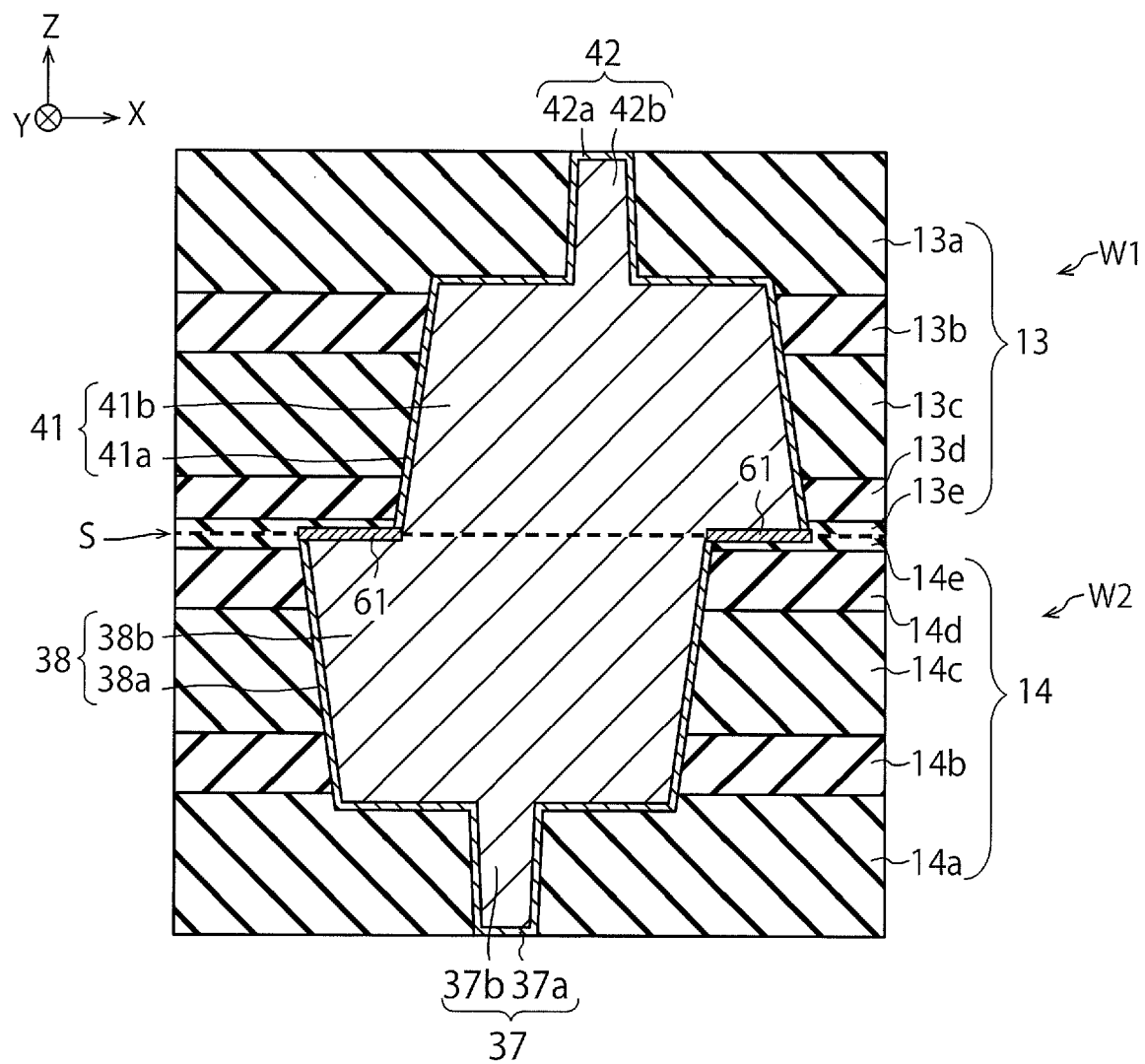
FIG. 18 is a sectional view showing a structure of a semiconductor device of a fourth embodiment.

FIG. 18 is a sectional view showing a structure of a semiconductor device of a fourth embodiment.

While the metal pads 38 and the via plugs 37 of the first to third embodiments form single damascene interconnects, the metal pads 38 and the via plugs 37 of the present embodiment are dual damascene interconnects. Therefore, a barrier metal layer 37a and a plug material layer 37b in the via plug 37 of the present embodiment are the same as the barrier metal layer 38a and the pad material layer 38b in the metal pad 38, respectively, and the plug material layer 37b in the via plug 37 is in contact with the pad material layer 38b in the metal pad 38. In other words, the barrier metal layers 38a and 37b are not provided on the boundary face between the pad material layer 38b and the plug material layer 37b. Each of the barrier metal layer 38a and the barrier metal layer 37b is an example of the first layer, and each of the pad material layer 38b and the plug material layer 37b is an example of the second layer.

Likewise, while the metal pads 41 and the via plugs 42 of the first to third embodiments form single damascene interconnects, the metal pads 41 and the via plugs 42 of the present embodiment form dual damascene interconnects. Therefore, a barrier metal layer 42a and a plug material layer 42b in the via plug 42 of the present embodiment are the same as the barrier metal layer 41a and the pad material layer 41b in the metal pad 41, respectively, and the plug material layer 42b in the via plug 42 is in contact with the pad material layer 41b in the metal pad 41. In other words, the barrier metal layers 41a and 42b are not provided on the boundary face between the pad material layer 41b and the plug material layer 42b. Each of the barrier metal layer 41a and the barrier metal layer 42b is an example of the third layer, and each of the pad material layer 41b and the plug material layer 42b is an example of the fourth layer.

The present embodiment makes it possible to form the metal pads 38 and the via plugs 37 in a few steps and makes it possible form the metal pads 41 and the via plugs 42 in a few steps. The semiconductor device of the present embodiment can be manufactured, for example, using a dual damascene method in place of a single damascene method in the step of FIG. 7 when the method shown in FIGS. 7 to 11 is applied.

Fifth Embodiment

Figure 19:
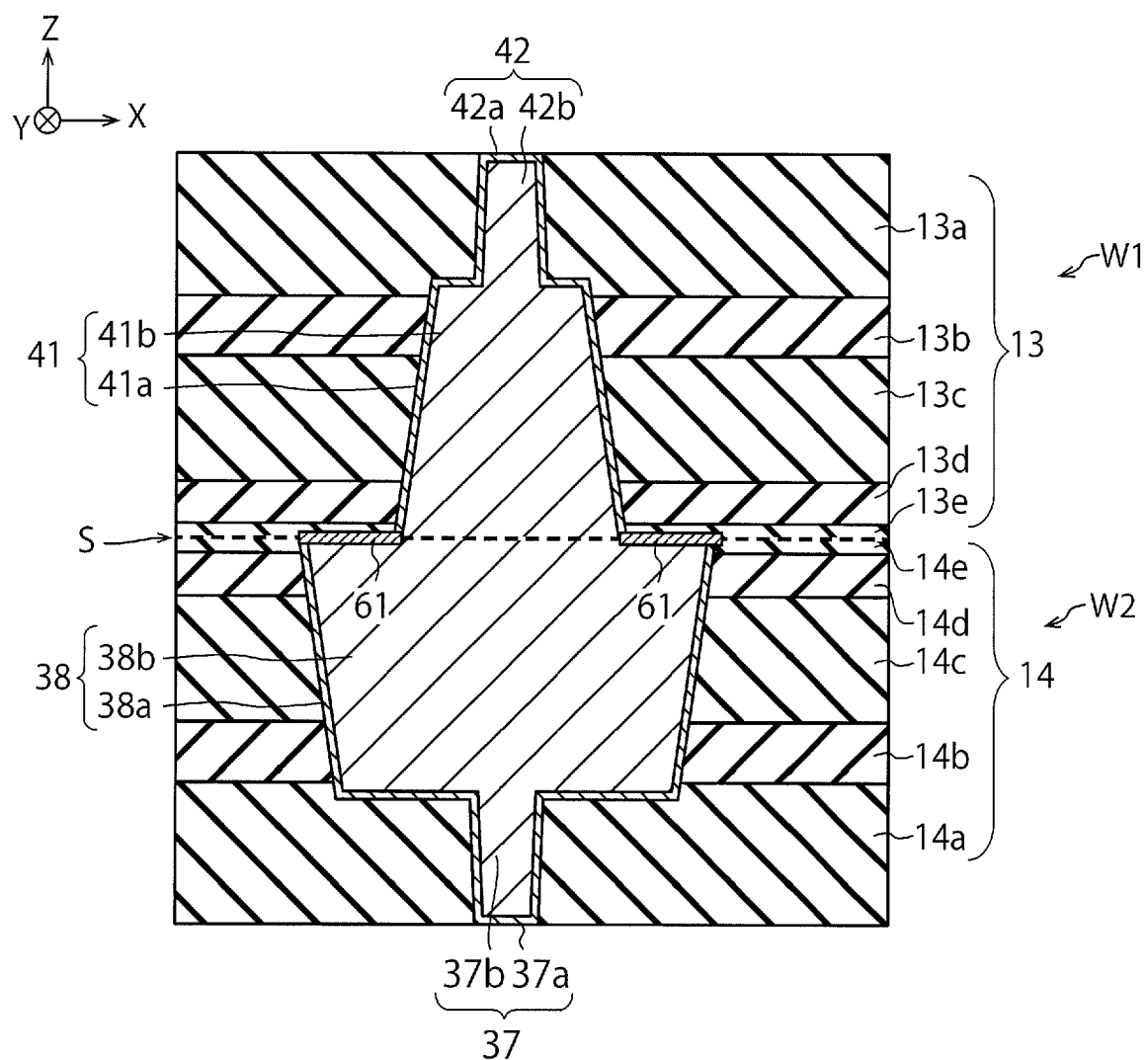
FIG. 19 is a sectional view showing a structure of a semiconductor device of a fifth embodiment.

FIG. 19 is a sectional view showing a structure of a semiconductor device of a fifth embodiment.

The metal pad 38 and the metal pad 41 of the present embodiment have different planar shapes. Both the planar shapes of the metal pad 38 and the metal pad 41 of the present embodiment are squares or rectangles, the width of the metal pad 41 in the X-direction is different from the width of the metal pad 38 in the X-direction, and the width of the metal pad 41 in the Y-direction is different from the width of the metal pad 38 in the Y-direction. For example, the width of the metal pad 41 in the X-direction is shorter than the width of the metal pad 38 in the X-direction, the width of the metal pad 41 in the Y-direction is shorter than the width of the metal pad 38 in the Y-direction, and the whole lower face of the metal pad 41 is in contact with a portion of the upper face of the metal pad 38.

Also the semiconductor device of the present embodiment includes the metal layer 61. The metal layer 61 of the present embodiment is formed through reaction of Ti atoms allowed to diffuse from the barrier metal layers 38a and 41a mainly with O atoms in the insulator 13e.

With the first to fourth embodiments, when there arises an error in positioning of the metal pad 38 and the metal pad 41, a contact area between the metal pad 38 and the metal pad 41 results in varying, and a contact resistance between the metal pad 38 and the metal pad 41 results in varying. On the other hand, in the present embodiment, even when there arises a small error in positioning of the metal pad 38 and the metal pad 41, the contact area between the metal pad 38 and the metal pad 41 does not vary, and the contact resistance between the metal pad 38 and the metal pad 41 does not vary. Therefore, the present embodiment makes it possible to restrain a problem caused by an error in positioning of the metal pad 38 and the metal pad 41.

Since the metal pad 38 and the metal pad 41 of the present embodiment have different planar shapes, even when there does not arise an error in positioning of the metal pad 38 and the metal pad 41, there appears a portion where the upper face of the metal pad 38 is positioned below the lower face of the inter layer dielectric 13 or a portion where the lower face of the metal pad 41 is positioned on the upper face of the inter layer dielectric 14. The present embodiment makes it possible to form the metal layer 61 in such a portion. Therefore, the present embodiment makes it possible to restrain a disadvantage in the case where the metal pad 38 and the metal pad 41 have different planar shapes while enjoying an advantage in the case where the metal pad 38 and the metal pad 41 have the planar shapes.

The semiconductor device of the present embodiment can be manufactured, for example, by making the planar shape of the metal pad 38 and the planar shape of the metal pad 41 different from each other in the step of FIG. 7 when the method shown in in FIGS. 7 to 11 is applied. In the present embodiment, the single damascene method may be used in place of the dual damascene method.

Sixth Embodiment

Figure 20:
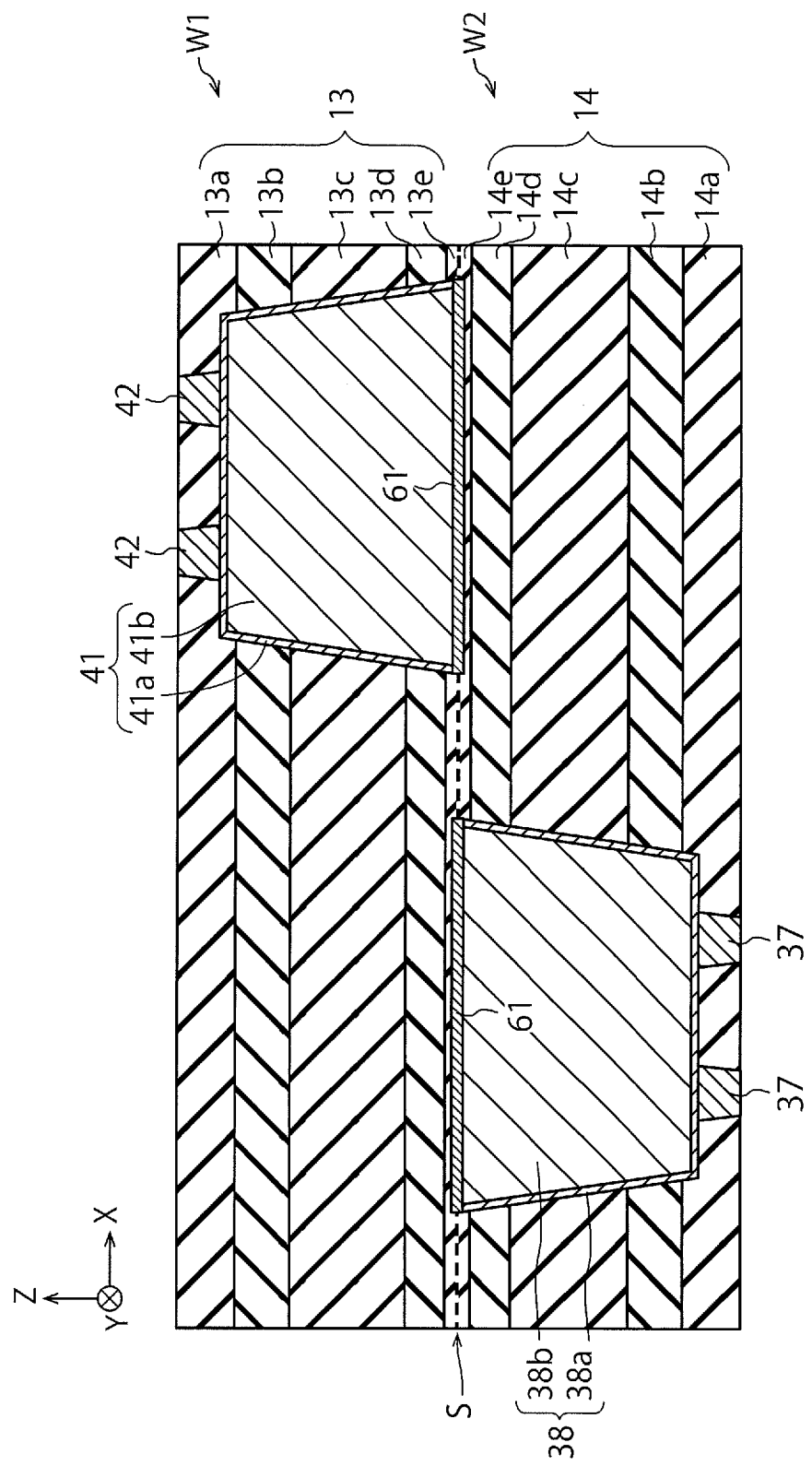
FIG. 20 is a sectional view showing a structure of a semiconductor device of a sixth embodiment.

FIG. 20 is a sectional view showing a structure of a semiconductor device of a sixth embodiment.

The semiconductor device of the present embodiment includes the metal pads 38 and 41 that are not in contact with each other as shown in FIG. 20 as well as the metal pads 38 and 41 that are in contact with each other (see FIG. 1 or the like). Those metal pads 38 and 41 are formed, for example, as dummy pads which are not used for electrically connecting the array wafer W1 and the circuit wafer W2. The dummy pads are formed, for example, in order to adjust the densities of the metal pads 38 and 41 on the bonding face S.

Also the semiconductor device of the present embodiment includes the metal layer 61. The metal layer 61 on the metal pad 38 of the present embodiment is formed through reaction of Ti atoms allowed to diffuse from the barrier metal layer 38a mainly with O atoms in the insulator 13e. Meanwhile, the metal layer 61 below the metal pad 41 of the present embodiment is formed through reaction of Ti atoms allowed to diffuse from the barrier metal layer 41a mainly with O atoms in the insulator 14e.

The semiconductor device of the present embodiment can be manufactured, for example, by bonding the array wafer W1 and the circuit wafer W2 together such that the metal pad 38 and the metal pad 41 shown in FIG. 20 are not in contact with each other in the step of FIG. 9 when the method shown in FIGS. 7 to 11 is applied.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

The invention claimed is:

1. A semiconductor device comprising:
a first insulator;
a first pad provided in the first insulator, and including:
  a first layer provided on a lateral face and a lower face of the first insulator, and
  a second layer provided on the lateral face and the lower face of the first insulator via the first layer;
a second insulator provided on the first insulator;
a second pad provided on the first pad in the second insulator, and including:
  a third layer provided on a lateral face and an upper face of the second insulator, and
  a fourth layer provided on the lateral face and the upper face of the second insulator via the third layer; and
a metal layer provided between an upper face of the first pad and a lower face of the second insulator or between a lower face of the second pad and an upper face of the first insulator, and including a metal element and oxygen, the metal element being the same as a metal element included in the first layer or the third layer.

2. The device of claim 1, wherein the metal element includes titanium, aluminum, or manganese.

3. The device of claim 1, wherein
the first layer is in contact with the lateral face and the lower face of the first insulator, or
the third layer is in contact with the lateral face and the upper face of the second insulator.

4. The device of claim 1, wherein
the first insulator includes a first film including oxygen and being in contact with a lower face of the metal layer, or
the second insulator includes a second film including oxygen and being in contact with an upper face of the metal layer.

5. The device of claim 4, wherein the first film or the second film is a native oxidized film.

6. The device of claim 4, wherein
the first insulator includes:
  the first film, and
  a third film including carbon and nitrogen and being in contact with a lower face of the first film, or
the second insulator includes:
  the second film, and
  a fourth film including carbon and nitrogen and being in contact with an upper face of the second film.

7. The device of claim 1, wherein the first pad and the second pad have same widths.

8. The device of claim 1, wherein the first pad and the second pad have different widths.

9. The device of claim 1, wherein
the first pad is provided on a first plug including the first and second layers, and the second layer in the first plug is in contact with the second layer in the first pad, or
the second pad is provided below a second plug including the third and fourth layers, and the fourth layer in the second plug is in contact with the fourth layer in the second pad.

10. A semiconductor device comprising:
a first insulator;
a first pad provided in the first insulator, and including:
  a first layer provided on a lateral face and a lower face of the first insulator, and
  a second layer provided on the lateral face and the lower face of the first insulator via the first layer;
a second insulator provided on the first insulator;
a second pad provided at a position where the second pad is not in contact with the first pad in the second insulator, and including:

a third layer provided on a lateral face and an upper face of the second insulator, and
a fourth layer provided on the lateral face and the upper face of the second insulator via the third layer; and
a metal layer provided between an upper face of the first pad and a lower face of the second insulator or between a lower face of the second pad and an upper face of the first insulator, and including a metal element and oxygen, the metal element being the same as a metal element included in the first layer or the third layer.

11. The device of claim 10, wherein the metal element includes titanium, aluminum, or manganese.

12. The device of claim 10, wherein
the first layer is in contact with the lateral face and the lower face of the first insulator, or
the third layer is in contact with the lateral face and the upper face of the second insulator.

13. The device of claim 10, wherein
the first insulator includes a first film including oxygen and being in contact with a lower face of the metal layer, or
the second insulator includes a second film including oxygen and being in contact with an upper face of the metal layer.

14. The device of claim 13, wherein
the first insulator includes:
the first film, and
a third film including carbon and nitrogen and being in contact with a lower face of the first film, or
the second insulator includes:
the second film, and
a fourth film including carbon and nitrogen and being in contact with an upper face of the second film.

* * * * *